(12) United States Patent  (10) Patent No.: US 7,567,101 B2
Yokozeki  (45) Date of Patent: Jul. 28, 2009

(54) DIGITAL PLL CIRCUIT

(75) Inventor: Wataru Yokozeki, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 574 days.

(21) Appl. No.: 11/216,166

(22) Filed: Sep. 1, 2005

(65) Prior Publication Data

US 2006/0001464 A1 Jan. 5, 2006

Related U.S. Application Data

(63) Continuation of application No. PCT/JP03/02637, filed on Mar. 6, 2003.

(51) Int. Cl.
*H03L 7/06* (2006.01)

(52) U.S. Cl. ........................ 327/156; 375/354; 375/376; 327/141

(58) Field of Classification Search .................. 375/354, 375/373, 375–376; 327/141, 156
See application file for complete search history.

(56) References Cited

U.S. PATENT DOCUMENTS

| 5,374,904 | A | * | 12/1994 | Ishibashi ...................... 331/17 |
| 5,475,344 | A | * | 12/1995 | Maneatis et al. .............. 331/57 |
| 6,326,826 | B1 | | 12/2001 | Lee |
| 6,329,854 | B1 | | 12/2001 | Lee et al. |
| 6,356,158 | B1 | * | 3/2002 | Lesea ........................... 331/11 |
| 6,445,252 | B1 | * | 9/2002 | Eilken et al. .................. 331/34 |
| 6,525,578 | B2 | * | 2/2003 | Ooishi ......................... 327/156 |
| 6,542,040 | B1 | * | 4/2003 | Lesea ........................... 331/11 |
| 7,113,011 | B2 | * | 9/2006 | Leung et al. ................. 327/149 |

FOREIGN PATENT DOCUMENTS

| JP | 8-274629 | A | 10/1996 |
| JP | 9-238072 | A | 9/1997 |
| KR | 2000-0018490 | A | 4/2000 |
| KR | 2000-0077451 | A | 12/2000 |

* cited by examiner

*Primary Examiner*—David C Payne
*Assistant Examiner*—Leon Flores
(74) *Attorney, Agent, or Firm*—Arent Fox LLP

(57) ABSTRACT

A frequency comparator compares frequencies of a reference clock and an output clock to output a frequency comparison signal. A frequency variable circuit is composed of a delay circuit, which has a plurality of inverting circuits connected in series, and a first selection circuit. The first selection circuit selects one of odd output signals outputted from odd-numbered inverting circuits, according to the frequency comparison signal to feedback the selected odd output signal to an input of the delay circuit as a feedback signal. A phase comparator compares phases of the reference clock and the output clock to output a phase comparison signal. A second selection circuit selects one of the odd output signals according to the phase comparison signal to output it as the output clock.

26 Claims, 22 Drawing Sheets

DIGITAL PLL CIRCUIT

CROSS REFERENCE TO RELATED APPLICATION

This application is a continuation application of International Application PCT/JP 03/02637, filed Mar. 6, 2003, and designating the U.S.

BACKGROUND OF THE INVENTION

1. Field of the Invention

The present invention relates to a digital PLL (Phase Locked Loop) circuit used in a frequency synthesizer, an FM demodulator, and the like.

2. Description of the Related Art

In such cases where digital data recorded on a recording medium such as a magnetic tape and a magneto-optic tape is reproduced, a reproduction clock is required for extracting reproduced data from information read from the recording medium. For example, a PLL circuit is used for generating a clock synchronous with such read information.

Forming a PLL circuit as an analog circuit has a problem of unstable operation under manufacturing variation and fluctuation in operating conditions (temperature, voltage, and so on) of semiconductor elements. In addition, since an analog circuit is larger in scale than a digital circuit, a circuit scale of the PLL circuit becomes larger. Therefore, the PLL circuit in recent years has come to be formed as a digital circuit. A digital PLL circuit of this kind is disclosed in, for example, Japanese Unexamined Patent Application Publication No. Hei 8-274629, and so on.

FIG. 1 shows a digital PLL circuit disclosed in Japanese Unexamined Patent Application Publication No. Hei 8-274629.

A digital PLL circuit 9 is composed of a phase comparator 1, a decoder 2, an output clock selection circuit 3, an oscillator 4, a clock generation circuit 5, a variable divider 6, a loop filter 7, and a frequency comparator 8.

The frequency comparator 8 detects a frequency error between a reference clock Sin and an output clock Sout to output frequency error signals. The loop filter 7 integrates the frequency error signals in order to prevent the influence by frequency jitter to output a control signal to the variable divider 6. The variable divider 6 frequency-divides a master clock outputted by the oscillator 4 at a division ratio in accordance with the control signal to output a divided master clock. Based on the divided master clock, the clock generation circuit 5 outputs a plurality of clocks having equally shifted phases. The phase comparator 1 detects a phase error between the reference clock Sin and the output clock Sout to output a phase error signal. The decoder 2 decodes the phase error signal to output an output clock selection signal. The output clock selection circuit 3 selects an optimum clock from the plural clocks outputted by the clock generation circuit 5, according to the output clock selection signal so as to minimize the phase error between the reference clock Sin and the output clock Sout and outputs the selected clock as the output clock Sout.

With the above-described configuration, the output clock Sout has a frequency and a phase that are adjusted so as to approximate the frequency and phase of the reference clock Sin respectively.

In the digital PLL circuit 9, the output clock Sout is generated by appropriately frequency-dividing the master clock generated by the oscillator 4. Therefore, the oscillator 4 has to generate the master clock having a frequency high enough to correspond to the frequency of the output clock Sout. Further, in the digital PLL circuit 9, the oscillator 4 and the variable divider 6 changing the frequency of the master clock outputted from the oscillator 4 are separately formed, resulting in an increase circuit scale.

SUMMARY OF THE INVENTION

It is an object of the present invention to provide a digital PLL circuit small in circuit scale and having a low jitter characteristic.

It is another object of the present invention to make the frequency and phase of an output clock of a digital PLL circuit match the frequency and phase of a reference clock respectively in a short time.

It is still another object of the present invention to adjust the frequency and phase of an output clock of a digital PLL circuit easily and independently of each other.

It is yet another object of the present invention to prevent the occurrence of a hazard or the like in an output clock of a digital PLL circuit.

It is yet another object of the present invention to easily divide or multiply the frequency of an output clock of a digital PLL circuit.

According to one of the aspects of the digital PLL circuit of the present invention, a frequency comparator compares a frequency of a reference clock and a frequency of an output clock generated according to the reference clock, to output a frequency comparison signal indicating a result of the comparison. A frequency variable circuit has a delay circuit and a first selection circuit. The delay circuit has a plurality of inverting circuits connected in series. The first selection circuit selects one of odd output signals outputted from odd-numbered inverting circuits, according to the frequency comparison signal to feedback the selected odd output signal to an input of the delay circuit as a feedback signal. Therefore, a frequency of the feedback signal can be changed according to the result of the comparison of the frequency comparator. A phase comparator compares phases of the reference clock and the output clock to output a phase comparison signal indicating a result of the comparison. A second selection circuit selects one of the odd output signals according to the phase comparison signal to output the selected odd output signal as the output clock. Therefore, the phase of the output clock can be changed according to the result of the comparison of the phase comparator.

The frequency variable circuit adjusts the number of connected stages of the inverting circuits constituting a feedback loop to function as a variable oscillator for changing the frequency of the output clock. This eliminates a need for separately forming an oscillator and a circuit for changing the frequency of a clock outputted from the oscillator, which allows reduction in circuit scale. Further, the delay circuit is used commonly for both the frequency adjustment and phase adjustment of the output clock, which allows reduction in circuit scale.

According to another mode of the digital PLL circuit of the present invention, the frequency comparator judges that the frequencies of the reference clock and the output clock match with each other to output a frequency match signal when a difference between the frequencies of the reference clock and the output clock falls within a predetermined range. The phase comparator compares the phases of the reference clock and the output clock while the frequency match signal is being outputted.

The phase of the output clock is adjusted after the frequency of the output clock matches the frequency of the reference clock. Since the frequency and phase of the output clock are independently adjusted, the adjustment of one of them does not influence the adjustment of the other. This allows stable adjustment of the frequency and phase of the output clock. As a result, it is possible to easily make the frequency and phase of the output clock match the frequency and phase of the reference clock respectively in a short time.

According to still another mode of the digital PLL circuit of the present invention, a first reference divider frequency-divides the reference clock at a predetermined division ratio to output the divided reference clock as a first divided reference clock. The frequency comparator has a first counter, a second counter, and a magnitude comparator. The first counter counts the reference clock to output a counted value as a first counter value signal. The second counter counts the output clock to output a counted value as a second counter value signal. The first and second counters are reset in response to the first divided reference clock. The magnitude comparator compares a first counter value indicated by the first counter value signal of the first counter and a second counter value indicated by the second counter value signal of the second counter to output a result of the comparison as the frequency comparison signal.

Therefore, it is possible to easily detect a difference between the frequencies of the reference clock and the output clock only by counting the number of clocks of the reference clock and that of the output clock and comparing the counted values.

According to yet another mode of the digital PLL circuit of the present invention, the magnitude comparator outputs a frequency match signal when the first and second counter values match with each other. The phase comparator compares the phases of the reference clock and the output clock while the frequency match signal is being outputted.

The phase of the output clock is adjusted after the frequency of the output clock matches the frequency of the reference clock. Since the frequency and phase of the output clocks are independently adjusted, the adjustment of one of them does not influence the adjustment of the other. This allows stable adjustment of the frequency and phase of the output clock. As a result, it is possible to easily make the frequency and phase of the output clock match the frequency and phase of the reference clock respectively in a short time.

According to yet another mode of the digital PLL circuit of the present invention, the magnitude comparator outputs a frequency match signal every time the first and second counter values match with each other. The first reference divider frequency-divides the reference clock at a predetermined division ratio to output the divided reference clock as the first divided reference clock. The first reference divider operates as a variable divider that sequentially increases a cycle of the first divided reference clock in response to the frequency match signal.

Therefore, a cycle at which the first and second counters are reset becomes longer every time the first and second counter values match with each other. Incremental amounts of the first and second counter values become larger every time the first and second counter values match with each other, which can improve accuracy of the frequency comparison. A period during which the frequencies of the reference clock and the output clock are compared (a count period) is sequentially changed from a shorter period to a longer period, so that accuracy of the frequency comparison can be improved in stages. As a result, it is possible to make the frequency of the output clock match the frequency of the reference clock in a short time compared with a case where accuracy of the frequency comparison is not changed.

According to yet another mode of the digital PLL circuit of the present invention, a first control circuit has a first up/down counter. The first up-down counter either counts up or counts down according to the frequency comparison signal outputted from the magnitude comparator, in synchronization with the first divided reference clock to output a counted value as a first selection signal. The first selection signal indicates an inverting circuit outputting the odd output signal to be selected by the first selection circuit. The first selection circuit receives the first selection signal as the frequency comparison signal.

The counter value of the first up/down counter indicates the inverting circuit outputting the odd output signal to be selected by the first selection circuit. Therefore, the first up/down counter performing a counting operation according to the result of the comparison of the magnitude comparator can facilitate adjusting the frequency of the output clock.

According to yet another mode of the digital PLL circuit of the present invention, a counter value of the first up/down counter is set to a value indicating an inverting circuit on a subsequent stage side out of the odd-numbered inverting circuits before the frequency comparator starts comparing the frequencies of the reference clock and the output clock.

Therefore, the feedback loop of the frequency variable circuit becomes relatively long before the frequency comparator starts the frequency comparison, which causes the output clock to have a frequency on a lower side out of oscillatable frequencies. Further, when a delay time corresponding to the number of connected stages of the inverting circuits that is to be changed by the frequency adjustment is larger than a half the cycle of the output clock not yet undergone the frequency adjustment, a glitch tends to occur in the output clock when the first selection circuit switches the odd output signal to be selected. Therefore, increasing the cycle of the output clock not yet undergone the frequency adjustment can lower the possibility of the glitch occurring in the output clock due to the frequency adjustment.

According to yet another mode of the digital PLL circuit of the present invention, the frequency comparator has a first adder. The first adder adds a predetermined value to the second counter value to output a result of the addition as an addition value signal. The magnitude comparator receives the addition value signal as the second counter value signal.

The second counter value recognized by the magnitude comparator is larger than the second counter value actually outputted from the second counter. Therefore, when the magnitude comparator judges that the first and second counter values match with each other, the frequency of the output clock is lower than the frequency of the reference clock. As a result, it is possible to prevent the frequency of the output clock from oscillating across the frequency of the reference clock due to the frequency adjustment when the cycle of the reference clock is not dividable by a delay time per stage of the inverting circuit in the delay circuit. That is, jitter of the output clock accompanying the frequency adjustment can be reduced.

According to yet another mode of the digital PLL circuit of the present invention, a second reference divider frequency-divides the reference clock at a predetermined division ratio to output the divided reference clock as a second divided reference clock. The phase comparator has a first and a second divider. The first divider frequency-divides the reference clock at a predetermined division ratio to output the divided reference clock as a first divided clock. The second divider frequency-divides the output clock at the same division ratio as the division ratio of the first divider to output the divided output clock as a second divided clock. The phase comparator compares phases of the first and second divided clocks to output a result of the comparison as the phase comparison signal. A second control circuit has a down counter. The down counter counts down according to the phase comparison signal in synchronization with the second divided reference clock to output a counted value as the second selection signal. The second selection signal indicates an inverting circuit outputting the odd output signal to be selected by the second selection circuit. A counter value of the down counter is set to a value indicating an inverting circuit on a subsequent stage side out of the odd-numbered inverting circuits before the phase comparator starts comparing the phases of the reference clock and the output clock. The second selection circuit receives the second selection signal as the phase comparison signal.

The phase comparator compares the phases of the first and second divided clocks, so that the frequency of the phase comparison can be lowered. Therefore, it is possible to reduce jitter of the output clock accompanying the phase adjustment. Further, the counter value of the down counter indicates the inverting circuit outputting the odd output signal to be selected by the second selection circuit. Therefore, the down counter performing the counting operation according to the result of the comparison of the phase comparator can facilitate adjusting the phase of the output clock.

Moreover, making the cycle of the output clock larger than the cycle of the reference clock necessarily causes the phase of the output clock to be deviated from the phase of the reference clock in a delay direction after the phase of the output clock matches the phase of the reference clock. Therefore, in the phase adjustment of the output clock, advancing the phase of the output clock makes it possible for the phase of the output clock to match the phase of the reference clock. Since adjustment for delaying the phase of the output clock is not necessary, the phase of the output clock can be adjusted with the simple down counter for advancing phases. As a result, a circuit scale can be reduced.

According to yet another mode of the digital PLL circuit of the present invention, the frequency comparator has a first subtracter. The first subtracter subtracts a predetermined value from the first counter value to output a result of the subtraction as a subtraction value signal. The magnitude comparator receives the subtraction value signal as the first counter value signal.

The first counter value recognized by the magnitude comparator is smaller than the first counter value actually outputted from the first counter. Therefore, when the magnitude comparator judges that the first and second counter values match with each other, the frequency of the output clock is lower than the frequency of the reference clock. As a result, it is possible to prevent the frequency of the output clock from oscillating across the frequency of the reference clock when the cycle of the reference clock is not dividable by a delay time per stage of the inverting circuit in the delay circuit. That is, jitter of the output clock accompanying the frequency adjustment can be reduced.

According to yet another mode of the digital PLL circuit of the present invention, a first reference divider frequency-divides the reference clock at a predetermined division ratio to output the divided reference clock as a first divided reference clock. The frequency comparator has a first counter, a second counter, and a second subtracter. The first counter counts the reference clock to output a counted value as a first counter value signal. The second counter counts the output clock to output a counted value as a second counter value signal. The first and second counters are reset in response to the first divided reference clock. The second subtracter finds a difference between a first counter value indicated by the first counter value signal of the first counter and a second counter value indicated by the second counter value signal of the second counter to output a found value as the frequency comparison signal.

Therefore, it is possible to easily detect the frequency difference between the reference clock and the output clock only by counting the number of clocks of the reference clock and that of the output clock to find the difference between the counted values.

According to yet another mode of the digital PLL circuit of the present invention, the second subtracter outputs a frequency match signal when the first and second counter values match with each other. The phase comparator compares the phases of the reference clock and the output clock while the frequency match signal is being outputted.

The phase of the output clock is adjusted after the frequency of the output clock matches the frequency of the reference clock. Since the frequency and phase of the output clock are independently adjusted, the adjustment of one of them does not influence the adjustment of the other. This allows stable adjustment of the frequency and phase of the output clock. As a result, it is possible to easily make the frequency and phase of the output clock match the frequency and phase of the reference clock respectively in a short time.

According to yet another mode of the digital PLL circuit of the present invention, the second subtracter outputs a frequency match signal every time the first and second counter values match with each other. The first reference divider frequency-divides the reference clock at the predetermined division ratio to output the divided reference clock as the first divided reference clock. The first reference divider operates as a variable divider that sequentially increases a cycle of the first divided reference clock in response to the frequency match signal.

Therefore, the cycle at which the first and second counters are reset becomes larger every time the first and second counter values match with each other. Incremental amounts of the first and second counter values become larger every time the first and second counter values match with each other, which can improve accuracy of the frequency comparison. A period during which the frequencies of the reference clock and the output clock are compared (a count period) is sequentially changed from a shorter period to a longer period, so that accuracy of the frequency comparison can be improved in stages. As a result, it is possible to make the frequency of the output clock match the frequency of the reference clock in a short time compared with a case where accuracy of the frequency comparison is not changed.

According to yet another mode of the digital PLL circuit of the present invention, a first control circuit has a second adder and a storage circuit. The second adder receives the frequency comparison signal outputted from the second subtracter and a first selection signal and adds a value indicated by the frequency comparison signal and a value indicated by the first selection signal to output a result of the addition as an updated value signal. The storage circuit receives the updated value signal in synchronization with the first divided reference clock to output a received value as the first selection signal. The first selection signal indicates an inverting circuit outputting the odd output signal to be selected by the first selection circuit. The first selection circuit receives the first selection signal as the frequency comparison signal.

A value of the storage circuit indicates the inverting circuit outputting the odd output signal to be selected by the first selection circuit. Therefore, updating the value of the storage circuit facilitates adjusting the frequency of the output clock.

Further, since the value of the storage circuit is updated to the value equal to the sum of the value of the storage circuit and the difference between the first and second counter values, it is possible to switch the odd output signal to be selected by the first selection circuit, not by one stage but by a plurality of stages at a time. As a result, it is possible to make the frequency of the output clock match the frequency of the reference clock in a short time.

According to yet another mode of the digital PLL circuit of the present invention, the storage circuit is set to a value indicating an inverting circuit on a subsequent stage side out of the odd-numbered inverting circuits before the frequency comparator starts comparing the frequencies of the reference clock and the output clock.

Therefore, before the frequency comparator starts the frequency comparison, the feedback loop of the frequency variable circuit becomes relatively long, which causes the output clock to have a frequency on a lower side out of oscillatable frequencies. Further, when a delay time corresponding to the number of connected stages of the inverting circuits that is changed by the frequency adjustment is larger than a half the cycle of the output clock not yet undergone the frequency adjustment, a glitch tends to occur in the output clock when the first selection circuit switches the odd output signal to be selected. Therefore, increasing the cycle of the output clock not yet undergone the frequency adjustment can lower the possibility of the glitch occurring in the output clock due to the frequency adjustment.

According to yet another mode of the digital PLL circuit of the present invention, the frequency comparator has a first adder. The first adder adds a predetermined value to the second counter value to output a result of the addition as an addition value signal. The second subtracter receives the addition value signal as the second counter value signal.

The second counter value recognized by the second subtracter is larger than the second counter value actually outputted from the second counter. Therefore, when the second subtracter judges that the first and second counter values match with each other, the frequency of the output clock is lower than the frequency of the reference clock. As a result, it is possible to prevent the frequency of the output clock from oscillating across the frequency of the reference clock due to the frequency adjustment when the cycle of the reference clock is not dividable by a delay time per stage of the inverting circuit in the delay circuit. That is, jitter of the output clock accompanying the frequency adjustment can be reduced.

According to yet another mode of the digital PLL circuit of the present invention, the frequency comparator has a first subtracter. The first subtracter subtracts a predetermined value from the first counter value to output a result of the subtraction as a subtraction value signal. The second subtracter receives the subtraction value signal as the first counter value signal.

The first counter value recognized by the second subtracter is smaller than the first counter value actually outputted from the first counter. Therefore, when the second subtracter judges that the first and second counter values match with each other, the frequency of the output clock is lower than the frequency of the reference clock. As a result, it is possible to prevent the frequency of the output clock from oscillating across the frequency of the reference clock due to the frequency adjustment when the cycle of the reference clock is not dividable by a delay time per stage of the inverting circuit in the delay circuit. That is, jitter of the output clock accompanying the frequency adjustment can be reduced.

According to yet another mode of the digital PLL circuit of the present invention, a second reference divider frequency-divides the reference clock at a predetermined division ratio to output the divided reference clock as a second divided reference clock. A second control circuit has a second up/down counter. The second up/down counter either counts up or counts down according to the phase comparison signal in synchronization with the second divided reference clock to output a counted value as a second selection signal. The second selection signal indicates an inverting circuit outputting the odd output signal to be selected by the second selection circuit. The second selection circuit receives the second selection signal as the phase comparison signal.

The counter value of the second up/down counter indicates the inverting circuit outputting the odd output signal to be selected by the second selection circuit. Therefore, the second up/down counter performing a counting operation according to the comparison result of the phase comparator can facilitate adjusting the phase of the output clock.

According to yet another mode of the digital PLL circuit of the present invention, a third control circuit outputs a third selection signal whose logic level is inverted when the counter value of the second up/down counter indicated by the second selection signal is changed from a maximum value to a minimum value and from the minimum value to the maximum value by a counting operation. The third selection circuit alternately outputs an inverted output clock resulting from an inversion of the output clock and the output clock, in response to a transition edge of the third selection signal. The frequency comparator and the phase comparator receive the clock outputted from the third selection circuit as the output clock.

The phase of the output clock is inverted in response to the transition edges of the third selection signal. Therefore, by inverting the phase of the output clock when the counter value of the second up/down counter changes from the maximum value to the minimum value, it is possible to set the phase of the output clock behind a phase corresponding to the maximum value of the counter value of the second up/down counter. Further, by inverting the phase of the output clock when the counter value of the second up/down counter changes from the minimum value to the maximum value, it is possible to set the phase of the output clock ahead of a phase corresponding to the minimum value of the counter value of the second up/down counter. This, as a result, allows wider-range adjustment of the phase of the output clock.

According to yet another mode of the digital PLL circuit of the present invention, a first control circuit outputs a first selection signal of a plurality of bits indicating an inverting circuit outputting the odd output signal to be selected by the first selection circuit, according to the frequency comparison signal. A second control circuit outputs a second selection signal of a plurality of bits indicating an inverting circuit outputting the odd output signal to be selected by the second selection circuit, according to the phase comparison signal. A first transition detector outputs a first transition signal during transition of the first selection signal. A second transition detector outputs a second transition signal during transition of the second selection signal. A first prohibition circuit is disposed between an output of the first selection circuit and an input of the delay circuit to prohibit an output of the first selection circuit from propagating to the delay circuit while the first transition signal is being outputted. A second prohibition circuit is disposed between an output of the second selection circuit and inputs of the frequency comparator and the phase comparator to prohibit an output of the second selection circuit from propagating to the frequency comparator and the phase comparator while the second transition signal is being outputted. The first selection circuit receives the first selection signal as the frequency comparison signal. The second selection circuit receives the second selection signal as the phase comparison signal.

Since the first prohibition circuit prohibits the output of the first selection circuit from propagating to the delay circuit during the transition of the first selection signal, it is possible to prevent a hazard or the like from occurring in the output clock due to the transition of the first selection signal. Since the second prohibition circuit prohibits the output of the second selection circuit from propagating to the frequency comparator and the phase comparator during the transition of the second selection signal, it is possible to prevent a hazard or the like from occurring in the output clock due to the transition of the second selection signal.

According to yet another mode of the digital PLL circuit of the present invention, a third reference divider frequency-divides the reference clock at a predetermined division ratio to output the divided reference clock as a third divided reference clock. A first output divider frequency-divides the output clock outputted from the second selection circuit at a predetermined division ratio to output the divided output clock as a first divided output clock. The frequency comparator and the phase comparator receive the third divided reference clock as the reference clock and receive the first divided output clock as the output clock.

For example, assuming that the division ratios of the third reference divider and the first output divider are 1/K and 1/L respectively, if L<K holds, the output clock can be frequency-divided by an arbitrary value. If L>K holds, the output clock can be multiplied by an arbitrary value. Further, if L=K holds, it is possible to make the frequency and phase of the output clock match the frequency and phase of the reference clock respectively even when the frequency of the reference clock is higher than an upper limit of frequencies comparable by the frequency comparator and the phase comparator.

According to yet another mode of the digital PLL circuit of the present invention, a second output divider frequency-divides the output clock outputted from the second selection circuit at a predetermined division ratio to output the divided output clock as a second divided output clock. A third output divider frequency-divides the second divided output clock at a predetermined division ratio to output the divided second divided output clock as the output clock. The first output divider receives the second divided output clock as the output clock.

Therefore, the number of the dividers capable of adjusting the frequency of the output clock is increased, and accordingly, assuming that the division ratios of the second and third output dividers are, for example, 1/M and 1/N respectively, the output clock can be frequency-divided with higher accuracy if L×M<K×N holds. Further, if L×M>K×N holds, the output clock can be multiplied with higher accuracy. If L×M=K×N holds, it is possible to make the frequency and phase of the output clock match the frequency and phase of the reference clock respectively even when the frequency of the reference clock is higher than an upper limit of frequencies comparable by the frequency comparator and the phase comparator.

According to another aspect of the digital PLL circuit of the present invention, a frequency comparator compares a frequency of a reference clock and a frequency of an output clock generated according to the reference clock, to output a frequency comparison signal indicating a result of the comparison. A frequency variable circuit has a delay circuit and a first selection circuit. The delay circuit has a plurality of inverting circuits connected in series. The first selection circuit selects one of odd output signals outputted from the odd-numbered inverting circuits, according to the frequency comparison signal to feedback the selected odd output signal to an input of the delay circuit as a feedback signal. Therefore, a frequency of the feedback signal can be changed according to the result of the comparison of the frequency comparator. A phase comparator compares phases of the reference clock and the output clock to output a phase comparison signal indicating a result of the comparison. A second up/down counter either counts up or counts down according to the phase comparison signal in synchronization with the reference clock to output a counted value as a second selection signal. A third control circuit outputs a third selection signal whose logic level is inverted when the counter value of the second up/down counter indicated by the second selection signal is changed from a maximum value to a minimum value and from the minimum value to the maximum value by a counting operation. A fourth selection circuit receives even output signals outputted from even-numbered inverting circuits and the odd output signals, and selects one of the odd output signals according to the second selection signal to output the selected odd output signal as the output clock in a period during which the third selection signal has a first logic level, while selecting one of the even output signals according to the second selection signal to output the selected even output signal as the output clock in a period during which the third selection signal has a second logic level. Therefore, it is possible to change the phase of the output clock according to the comparison result of the phase comparator.

The frequency variable circuit adjusts the number of connected stages of the inverting circuits constituting a feedback loop to function as a variable oscillator for changing the frequency of the output clock. This eliminates a need for separately forming an oscillator and a circuit for changing the frequency of a clock outputted from the oscillator, which allows reduction in circuit scale. Further, the delay circuit is used commonly for both the frequency adjustment and phase adjustment of the output clock, which allows reduction in circuit scale.

The phase of the output clock is inverted in response to transition edges of the third selection signal. Therefore, by inverting the phase of the output clock when the counter value of the second up/down counter changes from the maximum value to the minimum value, it is possible to set the phase of the output clock behind a phase corresponding to the maximum value of the counter value of the second up/down counter. Further, by inverting the phase of the output clock when the counter value of the second up/down counter changes from the minimum value to the maximum value, it is possible to set the phase of the output clock ahead of a phase corresponding to the minimum value of the counter value of the second up/down counter. This, as a result, allows wider-range adjustment of the phase of the output clock.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
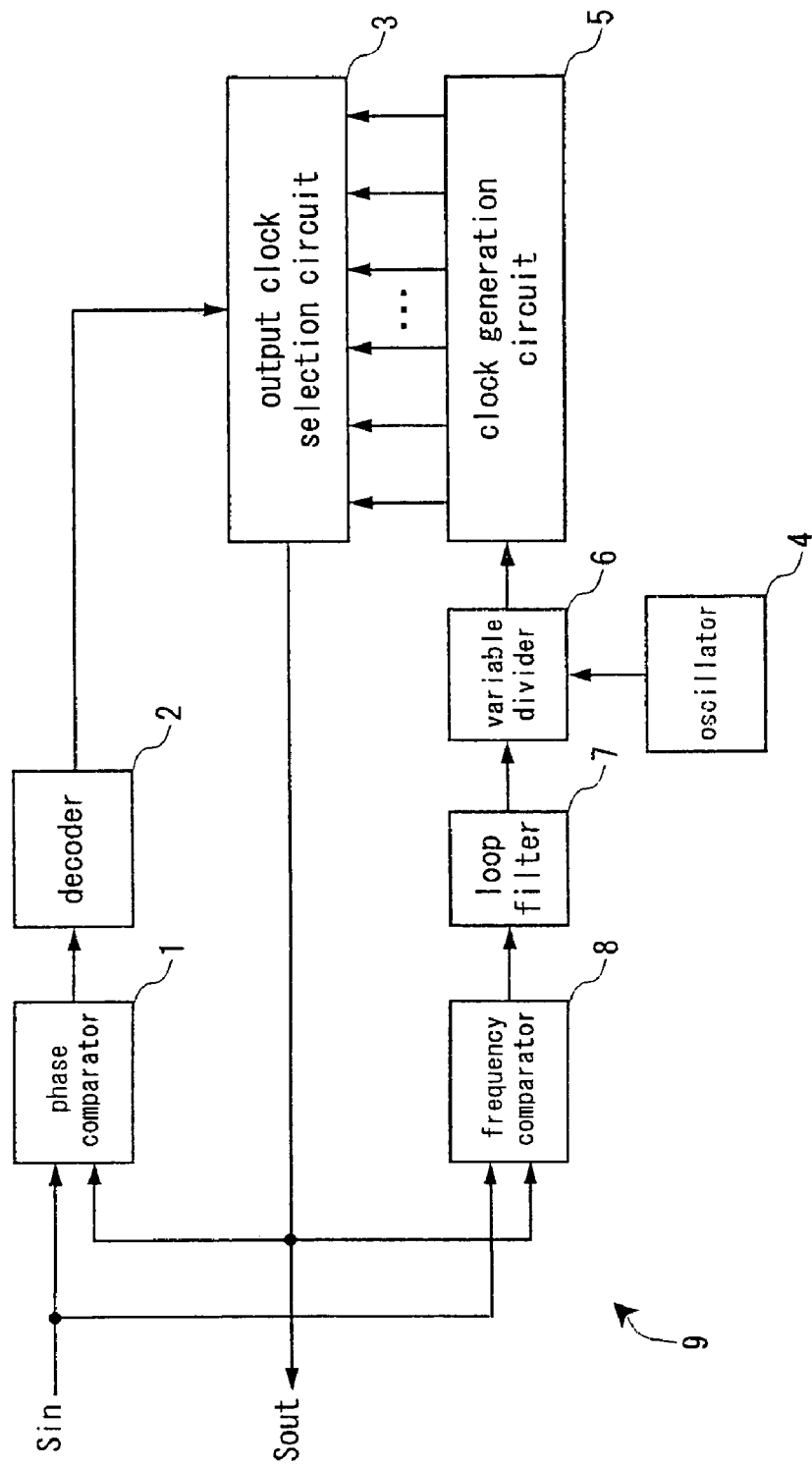
FIG. 1 is a block diagram showing a conventional digital PLL circuit.

Hereinafter, embodiment of the present invention will be described, using the drawings. In the drawings, each signal represented by the solid line consists of a plurality of bits.

Figure 2:
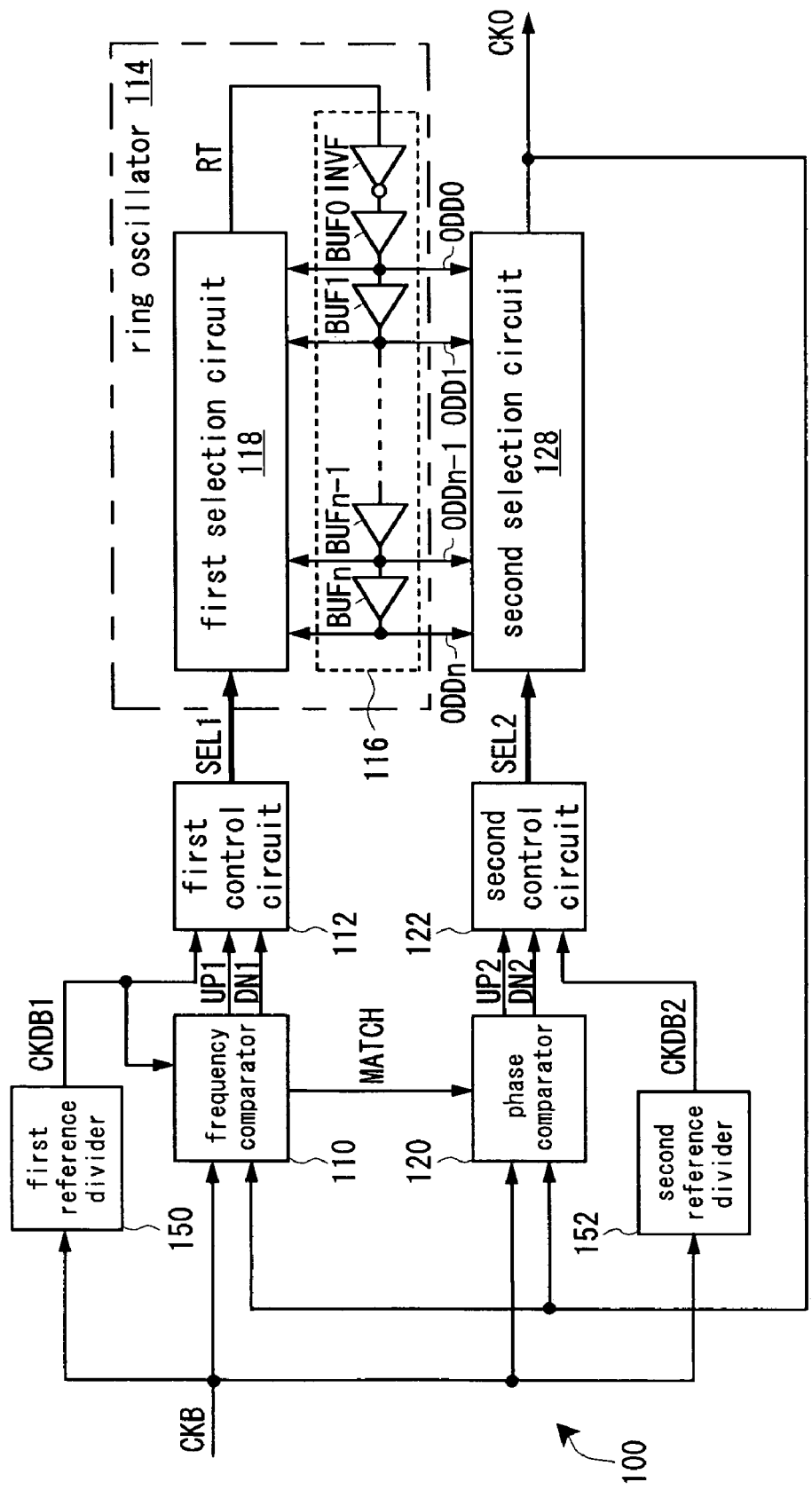
FIG. 2 is a block diagram showing a first embodiment of the digital PLL circuit of the present invention.

FIG. 2 shows a first embodiment of the digital PLL circuit of the present invention.

A digital PLL circuit 100 has a frequency comparator 110, a first control circuit 112, a ring oscillator 114 (a frequency variable circuit), a phase comparator 120, a second control circuit 122, a second selection circuit 128, a first reference divider 150, and a second reference divider 152.

In synchronization with a first divided reference clock CKDB1, the frequency comparator 110 compares a frequency of a reference clock CKB and a frequency of an output clock CKO, which is outputted from the second selection circuit 128 according to the reference clock CKB, to output frequency comparison signals UP1, DN1 indicating the comparison result. When a difference between the frequencies of the reference clock CKB and the output clock CKO falls within a predetermined range, the frequency comparator 110 judges that the frequencies of the both clocks match with each other to output a frequency match signal MATCH.

The first control circuit 112 outputs a first selection signal SEL1 of a plurality of bits in synchronization with the first divided reference clock CKDB1, according to the frequency comparison signals UP1, DN1. The first selection signal SEL1 indicates a buffer BUF (BUF0 to BUFn) outputting an odd output signal ODD (ODD0 to ODDn) that is to be selected by a first selection circuit 118. The frequency comparator 110 and the first control circuit 112 will be described in detail in FIG. 3.

The ring oscillator 114 has a delay circuit 116 and the first selection circuit 118. The delay circuit 116 is constituted by series-connecting an inverter INVF (an inverting circuit) and the buffers BUF (BUF0 to BUFn). Each of the buffers BUF is constituted of two inverters connected in series. The first selection circuit 118 selects one of the odd output signals ODD (ODD0 to ODDn) outputted from the buffers BUF, according to the first selection signal SEL1 to feedback, as a feedback signal RT, the selected odd output signal to an input of the inverter INVF which is an input of the delay circuit 116. A feedback loop is constantly constituted of an array of the inverters on odd-numbered stages. Therefore, the ring oscillator 114 adjusts the number of connected stages of the buffers BUF constituting the feedback loop to operate as a variable oscillator that changes the frequency of the output clock CKO. Therefore, it is not necessary to separately form an oscillator and a circuit for changing the frequency of a clock outputted from the oscillator, resulting in a reduced circuit scale.

While the frequency match signal MATCH is being outputted, the phase comparator 120 compares phases of the reference clock CKB and the output clock CKO to output phase comparison signals UP2, DN2 indicating the comparison result.

The second control circuit 122 outputs a second selection signal SEL2 of a plurality of bits in synchronization with a second divided reference clock CKDB2, according to the phase comparison signals UP2, DN2. The second selection signal SEL2 indicates the buffer BUF (BUF0 to BUFn) outputting the odd output signal ODD (ODD0 to ODDn) to be selected by the second selection circuit 128. The phase comparator 120 and the second control circuit 122 will be described in detail in FIG. 4.

The second selection circuit 128 selects one of the odd output signals ODD (ODD0 to ODDn) according to the second selection signal SEL2 to output it as the output clock CKO. The first selection circuit 118 and the second selection circuit 128 will be described in detail in FIG. 5.

The first reference divider 150 frequency-divides the reference clock CKB at a predetermined division ratio to output it as the first divided reference clock CKDB1.

The second reference divider 152 frequency-divides the reference clock CKB at a predetermined division ratio to output it as the second divided reference clock CKDB2.

Figure 3:
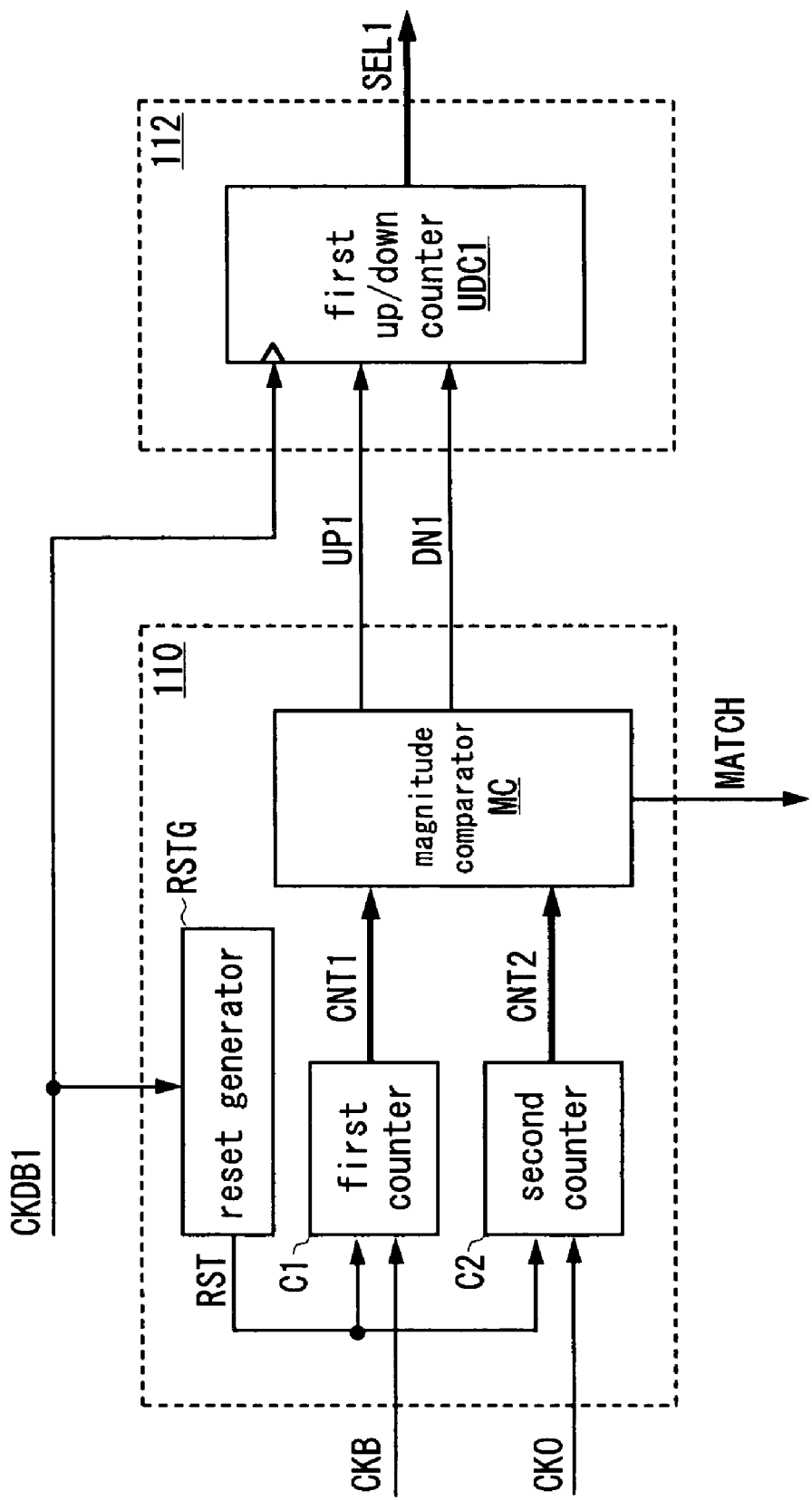
FIG. 3 is a block diagram showing details of a frequency comparator and a first control circuit in the first embodiment.

FIG. 3 shows details of the frequency comparator 110 and the first control circuit 112 in the first embodiment.

The frequency comparator 110 has a first counter C1, a second counter C2, a reset generator RSTG, and a magnitude comparator MC.

The first counter C1 counts the number of clocks of the reference clock CKB to output a counted value as a first counter value signal CNT1 of a plurality of bits.

The second counter C2 counts the number of clocks of the output clock CKO to output a counted value as a second counter value signal CNT2 of a plurality of bits.

The reset generator RSTG detects rising edges of the first divided reference clock CKDB1 to output a reset signal RST which is a pulse signal. The first counter C1 and the second counter C2 are reset in response to the reset signal RST. For example, in the first counter C1 and the second counter C2, all the bits are reset to "0" in response to the reset signal RST.

The magnitude comparator MC compares a first counter value indicated by the first counter value signal CNT1 of the first counter C1 and a second counter value indicated by the second counter value signal CNT2 of the second counter C2 to output the comparison result as the frequency comparison signals UP1, DN1. For example, when the first counter value is smaller than the second counter value, the frequency comparison signals UP1, DN1 are fixed to "logic 1" and "logic 0" respectively. When the first counter value is larger than the second counter value, the frequency comparison signals UP1, DN1 are fixed to "logic 0" and "logic 1" respectively. When the first and second counter values match with each other, the frequency comparison signals UP1, DN1 are both fixed to "logic 0".

The magnitude comparator MC outputs the frequency match signal MATCH when the first and second counter values match with each other. The frequency match signal MATCH is generated by, for example, synchronizing a NOT signal of the logical sum of the frequency comparison signals UP1, DN1 with a rising edge of the first divided reference clock CKDB1. The frequency match signal MATCH is fixed to "logic 1" when the first and second counter values match with each other. The frequency match signal MATCH is fixed to "logic 0" when the first and second counter values do not match with each other.

The first control circuit 112 has a first up/down counter UDC1. The first up/down counter UDC1 either counts up or counts down according to the frequency comparison signals UP1, DN1 in synchronization with the first divided reference clock CKDB1 to output a counted value as the first selection signal SEL1. For example, when the frequency comparison signal UP1 has "logic 1", the first up/down counter UDC1 counts up in synchronization with the rising edge of the first divided reference clock CKDB1. When the frequency comparison signal DN1 has "logic 1", the first up/down counter UDC1 counts down in synchronization with the rising edge of the first divided reference clock CKDB1. The first up/down counter UDC1 does not perform the counting operation when the frequency comparison signals UP1, DN1 both have "logic 0".

Consequently, the first selection circuit 118 switches the odd output signal ODD to be selected, by one stage at a time according to the comparison result of the frequency comparator 110. Specifically, when the frequency of the output clock CKO is higher than the frequency of the reference clock CKB, the first up/down counter UDC1 counts up.

Accordingly, a value indicated by the first selection signal SEL1 increases by one. That is, the first selection circuit 118 switches the odd output signal ODD to be selected, by one stage in a subsequent stage direction (left direction of the delay circuit 116 in FIG. 2). When the frequency of the output clock CKO is lower than the frequency of the reference clock CKB, the first up/down counter UDC1 counts down. Accordingly, the value indicated by the first selection signal SEL1 decreases by one. That is, the first selection circuit 118 switches the odd output signal ODD to be selected, by one stage in a preceding stage direction.

Further, before the frequency comparator 110 starts comparing the frequencies of the reference clock CKB and the output clock CKO (for example, at the power-on time of the digital PLL circuit 100), the first up/down counter UDC1 is set to a value corresponding to the buffer BUFn on the final stage shown in FIG. 2 to output in advance the first selection signal SEL1 indicating the buffer BUFn. That is, the first selection circuit 118 selects the odd output signal ODDn in advance. Accordingly, the frequency of the output clock CKO is set in advance to the lowest frequency out of oscillatable frequencies.

Figure 4:
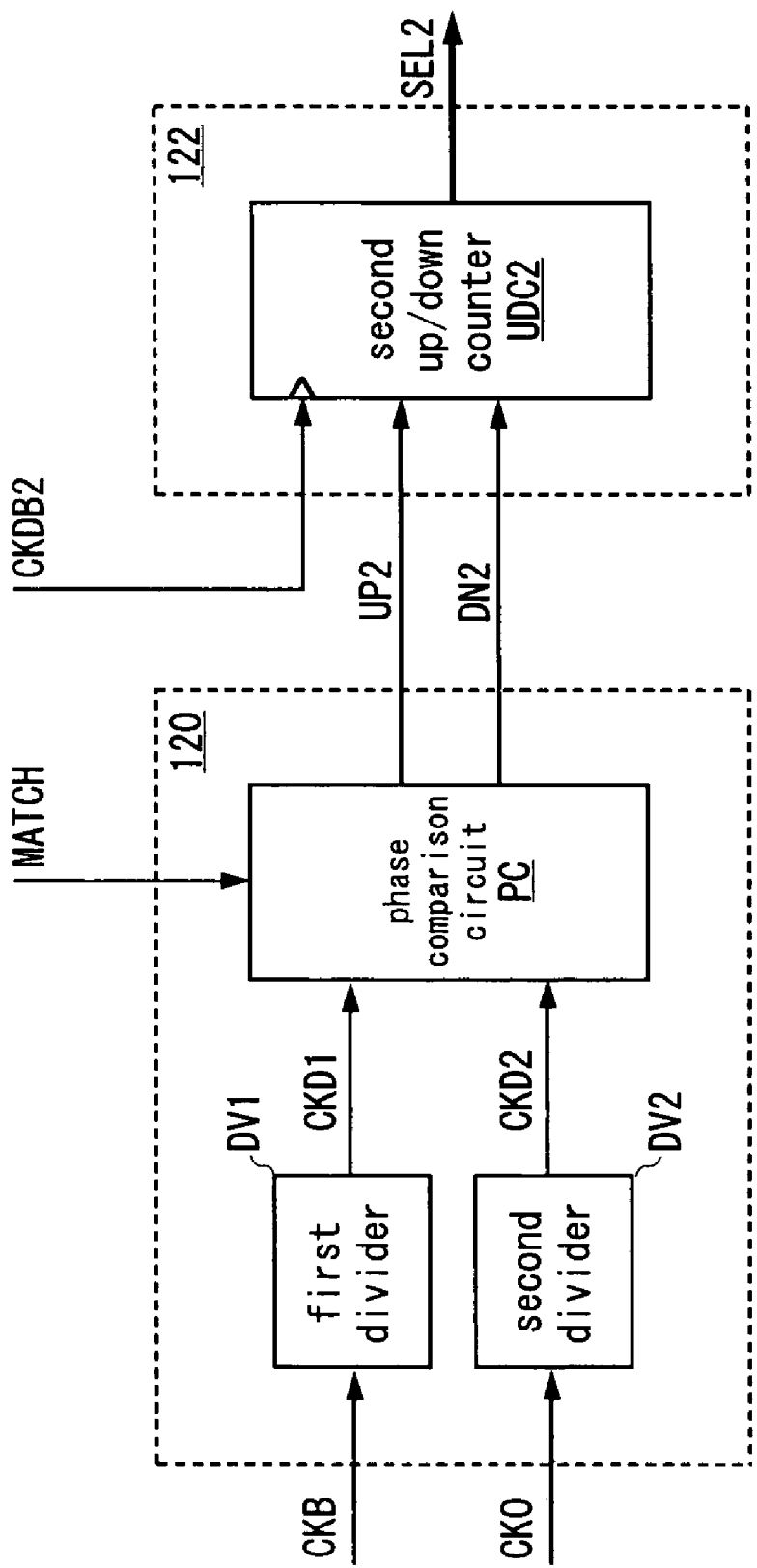
FIG. 4 is a block diagram showing details of a phase comparator and a second control circuit in the first embodiment.

FIG. 4 shows details of the phase comparator 120 and the second control circuit 122 in the first embodiment.

The phase comparator 120 has a first divider DV1, a second divider DV2, and a phase comparison circuit PC.

The first divider DV1 frequency-divides the reference clock CKB at a predetermined division ratio to output it as a first divided clock CKD1.

The second divider DV2 frequency-divides the output clock CKO at the same division ratio as that of the first divider DV1 to output it as a second divided clock CKD2.

While the frequency match signal MATCH is being outputted (for example, when the frequency match signal has "logic 1"), the phase comparison circuit PC compares phases of the first divided clock CKD1 and the second divided clock CKD2 to output the comparison result as the phase comparison signals UP2, DN2. For example, when the phase of the second divided clock CKD2 is ahead of the phase of the first divided clock CKD1, the phase comparison signals UP2, DN2 are fixed to "logic 1" and "logic 0" respectively. When the phase of the second divided clock CKD2 is behind the phase of the first divided clock CKD1, the phase comparison signals UP2, DN2 are fixed to "logic 0" and "logic 1" respectively. When the phases of the first divided clock CKD1 and the second divided clock CKD2 match with each other, the phase comparison signals UP2, DN2 are both fixed to "logic 0". Since the phase comparison circuit PC compares the phases of the first divided clock CKD1 and the second divided clock CKD2, the frequency of the phase comparison is lowered. This reduces jitter of the output clock CKO accompanying the phase adjustment. The lowered frequency of the phase comparison reduces power consumption of a semiconductor integrated circuit on which the digital PLL circuit 100 is mounted.

The second control circuit 122 has a second up/down counter UDC2. The second up/down counter UDC2 either counts up or counts down according to the phase comparison signals UP2, DN2, in synchronization with the second divided reference clock CKDB2 to output a counted value as the second selection signal SEL2. For example, when the phase comparison signal UP2 has "logic 1", the second up/down counter UDC2 counts up in synchronization with a rising edge of the second divided reference clock CKDB2. When the phase comparison signal DN2 has "logic 1", the second up/down counter UDC2 counts down in synchronization with the rising edge of the second divided reference clock CKDB2. When the phase comparison signals UP2, DN2 both have "logic 0", the second up/down counter UDC2 does not perform the counting operation.

Consequently, the second selection circuit 128 switches the odd output signal ODD to be selected, by one stage at a time according to the comparison result of the phase comparator 120. Specifically, when the phase of the output clock CKO is ahead of the phase of the reference clock CKB, the second up/down counter UDC2 counts up. Accordingly, a value indicated by the second selection signal SEL2 increases by one. That is, the second selection circuit 128 switches the odd output signal ODD to be selected, by one stage in a subsequent stage direction. When the phase of the output clock CKO is behind the phase of the reference clock CKB, the second up/down counter UDC2 counts down. Accordingly, the value indicated by the second selection signal decreases by one. That is, the second selection circuit 128 switches the odd output signal ODD to be selected, by one stage in a preceding stage direction.

Figure 5:
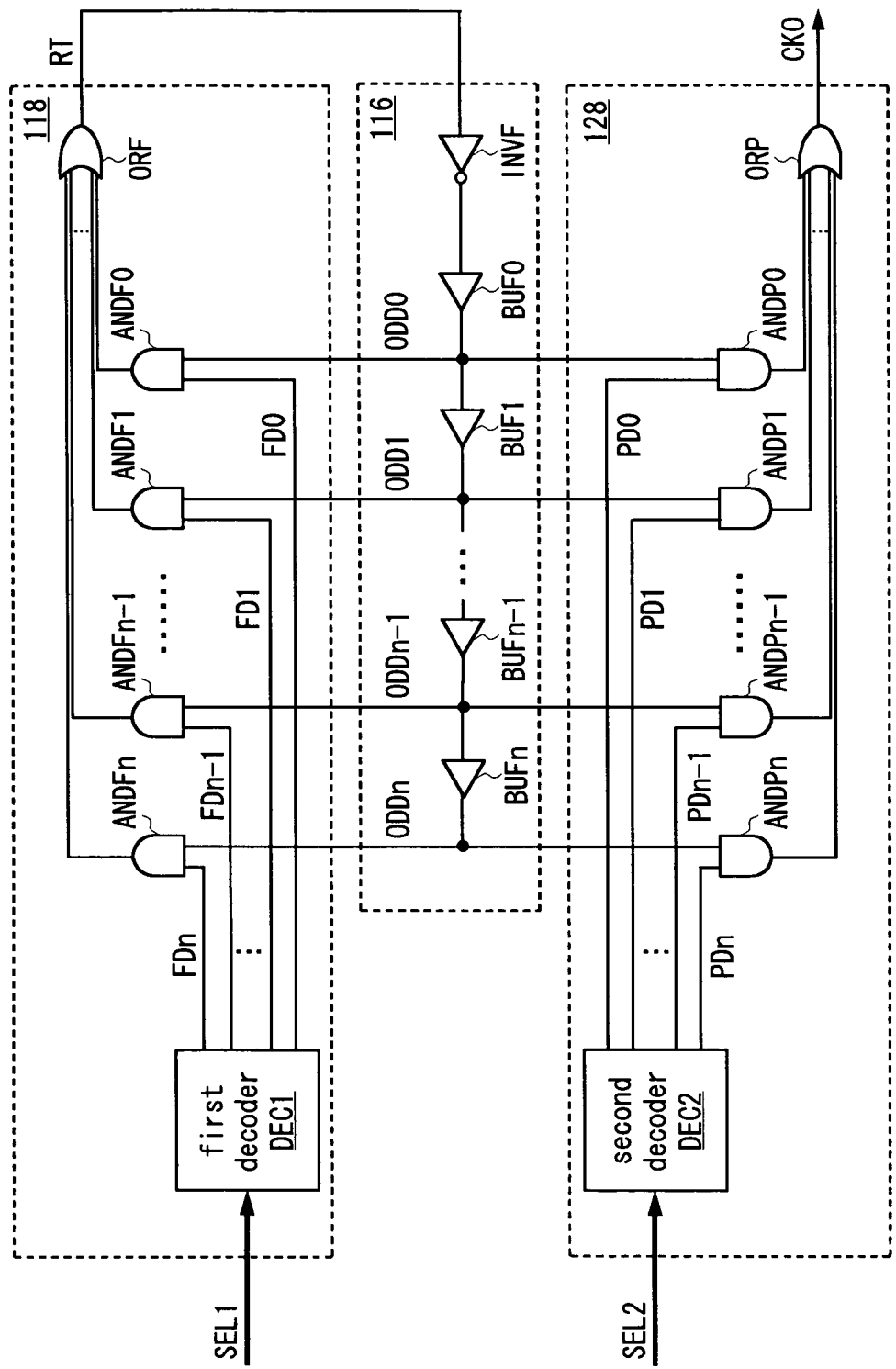
FIG. 5 is a block diagram showing an example of a first and a second selection circuit in the first embodiment.

FIG. 5 shows an example of the first selection circuit 118 and the second selection circuit 128 in the first embodiment.

The first selection circuit 118 has a first decoder DEC1, AND circuits ANDF (ANDF0 to ANDFn), and an OR circuit ORF.

The first decoder DEC1 decodes the first selection signal SEL1 outputted from the first control circuit 112 shown in FIG. 2 to output a decoded signal FD of n bits (FD0 to FDn). For example, in the decoded signal FD, a bit corresponding to the value indicated by the first selection signal SEL1 is fixed to "logic 1". In the decoded signal FD, bits other than the bit corresponding to the value indicated by the first selection signal SEL1 are fixed to "logic 0".

Each of the AND circuits ANDF performs an AND operation on corresponding bits of the decoded signal FD and the odd output signal ODD to output the operation result. The OR circuit ORF performs an OR operation on the results of the AND operations outputted from the respective AND circuits ANDF to output the operation result as a feedback signal RT. Accordingly, the first selection circuit 118 switches the odd output signal ODD to be selected, according to the first selection signal SEL1. Therefore, the number of stages of the buffers BUF included in a feedback loop in the ring oscillator 114 is controlled according to the first selection signal SEL1. That is, a frequency of the feedback signal RT is adjusted according to the comparison result of the frequency comparator 110.

The second selection circuit 128 has a second decoder DEC2, AND circuits ANDP (ANDP0 to ANDPn), and an OR circuit ORP.

The second decoder DEC2 decodes the second selection signal SEL2 outputted from the second control circuit 122 to output a decoded signal PD of n bits (PD0 to PDn). For example, in the decoded signal PD, a bit corresponding to the value indicated by the second selection signal SEL2 is fixed to "logic 1". In the decoded signal PD, bits other than the bit corresponding to the value indicated by the second selection signal SEL2 are fixed to "logic 0".

Each of the AND circuits ANDP performs an AND operation on corresponding bits of the decoded signal PD and the odd output signal ODD to output the operation result. The OR circuit ORP performs an OR operation on the results of the AND operations outputted from the respective AND circuits ANDP to output the operation result as the output clock CKO. Accordingly, the second selection circuit 128 switches the odd output signal ODD to be selected, according to the second selection signal SEL2. Therefore, the number of stages of the buffers BUF included in a path from an output of the first selection circuit 118 to an input of the second selection circuit 128 is controlled according to the second selection signal SEL2. That is, the phase of the output clock CKO is adjusted according to the comparison result of the phase comparator 120. Further, the buffers BUF not included in the feedback loop in the ring oscillator 114 are also used for the phase adjustment of the output clock CKO, so that the buffers BUF in the delay circuit 116 can be effectively utilized.

With the above-described configuration, the delay circuit 116 is used commonly for both the frequency adjustment and phase adjustment of the output clock CKO, resulting in a reduced circuit scale of the digital PLL circuit 100.

Here, operations of the first embodiment will be described using a concrete example.

For example, the frequencies of the reference clock CKB and the output clock CKO are assumed to be 100 MHz (cycle: 10 ns) and 50 MHz (cycle: 20 ns) respectively. The division ratio of the first reference divider 150 is assumed to be 1/16.

Therefore, the cycle during which the frequencies of the reference clock CKB and the output clock CKO are compared is assumed to be 160 ns. The division ratios of the second reference divider 152, the first divider DV1, and the second divider DV2 are all assumed to be 1/16. Therefore, the cycle during which the phases of the reference clock CKB and the output clock CKO are compared is assumed to be 160 ns. A delay time per stage of the buffer BUF is assumed to be 0.1 ns. The first selection circuit 118 is assumed to select an $x^{th}$ odd output signal ODDx. The second selection circuit 128 is assumed to select a $y^{th}$ odd output signal ODDy.

First, in order to make the frequency of the output clock CKO match the frequency of the reference clock CKB, the frequency of the output clock CKO is adjusted.

In the first counter C1 and the second counter C2 In the frequency comparator 110, all bits of are reset to "0" in response to the reset signal RST. Thereafter, the first counter C1 performs the counting operation on the reference clock CKB sixteen times before it is reset again. Therefore, the first counter value is counted up to "16". The second counter C2 performs the counting operation on the output clock CKO eight times before it is reset again. The second counter value is counted up to "8". At this time, the magnitude comparator MC judges that the first counter value is larger than the second counter value to fix the frequency comparison signals UP1, DN1 to "logic 0" and "logic 1" respectively. Further, since the first and second counter values do not match with each other, the frequency match signal MATCH is fixed to "logic 0".

The first up/down counter UDC1 counts down in synchronization with the rising edge of the first divided reference clock CKDB1 since the frequency comparison signal DN1 has "logic 1". Consequently, the counter value of the first up/down counter UDC1 is changed from x to x−1. In other words, the value indicated by the first selection signal SEL1 is changed from x to x−1.

The first selection circuit 118 switches the odd output signal ODD to be selected, from the odd output signal ODDx to an odd output signal ODDx−1. Accordingly, the cycle of the output clock CKO is reduced to 19.8 ns. Therefore, the frequency of the output clock CKO is heightened to about 50.51 MHz.

Since a difference in cycle (frequency difference) between the references clock CKB and the output clock CKO is 10 ns, 50-time repetition of the above-described frequency adjustment makes the first and second counter values match with each other. Accordingly, the frequency of the output clock CKO matches the frequency of the reference clock CKB. In other words, the frequency of the output clock CKO is locked. At this time, the frequency match signal MATCH is fixed to "logic 1".

After the frequency of the output clock CKO matches the frequency of the reference clock CKB, the phase of the output clock CKO is adjusted in order to make the phase of the output clock CKO match the phase of the reference clock CKB. Note that, here, the phase of the output clock CKO is assumed to be behind the phase of the reference clock CKB when the frequency of the output clock CKO matches the frequency of the reference clock CKB.

In the phase comparator 120, the phase comparison circuit PC judges that the phase of the second divided clock CKD2 is behind the phase of the first divided clock CKD1 to fix the phase comparison signals UP2, DN2 to "logic 0" and "logic 1" respectively.

The second up/down counter UDC2 counts down in synchronization with the rising edge of the second divided reference clock CKDB2 since the phase comparison signal DN2 has "logic 1". Accordingly, the counter value of the second up/down counter UDC2 is changed from y to y−1. In other words, the value indicated by the second selection signal SEL2 is changed from y to y−1.

The second selection circuit 128 switches the odd output signal ODD to be selected, from the odd output signal ODDy to an odd output signal ODDy−1. Accordingly, the phase of the output clock CKO advances by 0.1 ns. The advancement of the phase of the output clock CKO by 0.1 ns reduces the phase difference between the reference clock CKB and the output clock CKO by 0.1 ns.

Since the frequency of the reference clock CKB is 100 MHz, the phase difference between the reference clock CKB and the output clock CKO is 10 ns (one cycle) at the maximum. Therefore, 100-time repetition of the above-described phase adjustment at the maximum makes the phase of the output clock CKO match the phase of the reference clock CKB.

Note that the frequency adjustment is still continued after the frequency of the output clock CKO matches the frequency of the reference clock CKB (including the period during the phase adjustment). Therefore, when the frequency of the output clock CKO is deviated from the frequency of the reference clock CKB, the frequency adjustment of the output clock CKO as described above is made again. At this time, the frequency match signal MATCH changes from "logic 1" to "logic 0" indicating frequency discrepancy. Further, the phase adjustment is still continued after the phase of the output clock CKO matches the phase of the reference clock CKB. Therefore, when the phase of the output clock CKO is deviated from the phase of the reference clock CKB, the phase adjustment of the output clock CKO as described above is made again.

The first embodiment described above can provide the following effects.

The ring oscillator 114 adjusts the number of connected stages of the buffers BUF constituting the feedback loop to function as a variable oscillator for changing the frequency of the output clock CKO. Further, the delay circuit 116 is used commonly for both the frequency adjustment and phase adjustment of the output clock CKO. This can reduce a circuit scale.

The phase of the output clock CKO is adjusted after the frequency of the output clock CKO matches the frequency of the reference clock CKB. Since the frequency and phase of the output clock CKO are independently adjusted, the adjustment of one of them does not influence the adjustment of the other. This allows stable adjustment of the frequency and phase of the output clock CKO. As a result, it is possible to easily make the frequency and phase of the output clock CKO match the frequency and phase of the reference clock CKB respectively in a short time.

The frequency of the output clock CKO is set in advance to the lowest frequency out of the oscillatable frequencies, so that the cycle of the output clock CKO not yet undergone the frequency adjustment can be made large. Further, if the delay time corresponding to the number of connected stages of the buffers BUF that is changed by the frequency adjustment is larger than a half the cycle of the output clock CKO not yet undergone the frequency adjustment, a glitch tends to occur in the output clock CKO when the first selection circuit 118 switches the odd output signal ODD to be selected. Therefore, increasing the cycle of the output clock CKO not yet undergone the frequency adjustment can lower the possibility of the glitch occurring in the output clock CKO due to the frequency adjustment.

Since the phase comparator 120 compares the phases of the first divided clock CKD1 and the second divided clock CKD2, the frequency of the phase comparison can be lowered. This can reduce jitter of the output clock CKO occurring due to the phase adjustment. In addition, the lowered frequency of the phase comparison can reduce power consumption of a semiconductor integrated circuit on which the digital PLL circuit 100 is mounted.

Figure 6:
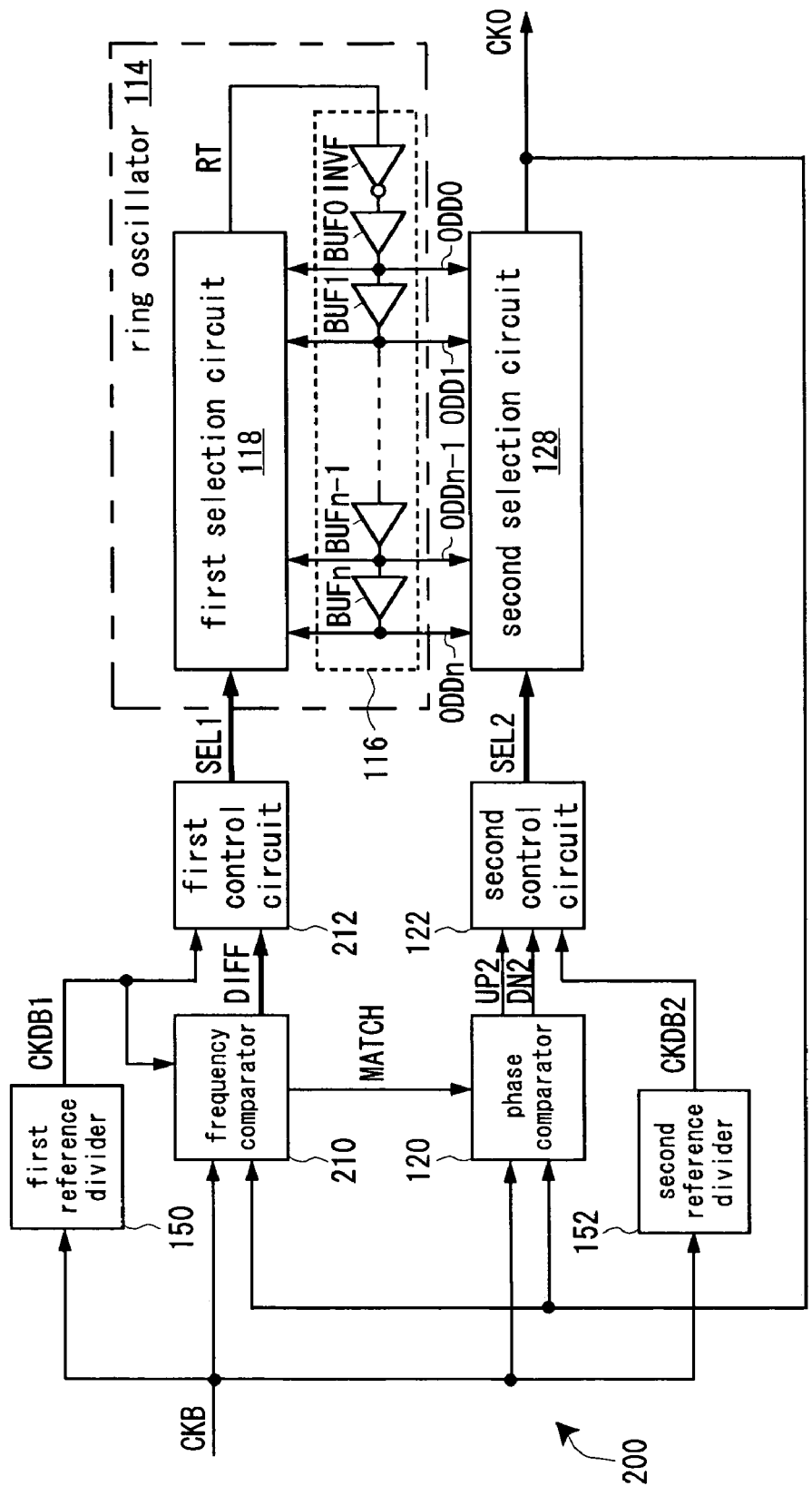
FIG. 6 is a block diagram showing a second embodiment of the digital PLL circuit of the present invention.

FIG. 6 shows a second embodiment of the digital PLL circuit of the present invention. The same reference numerals or symbols are used to designate the same elements as the elements described in the first embodiment, and detailed description thereof will be omitted.

A digital PLL circuit 200 has a frequency comparator 210 and a first control circuit 212 in place of the frequency comparator 110 and the first control circuit 112 of the first embodiment. The other configuration is the same as that of the first embodiment.

In synchronization with a first divided reference clock CKDB1, the frequency comparator 210 compares a frequency of a reference clock CKB and a frequency of an output clock CKO, which is outputted from a second selection circuit 128 according to the reference clock CKB, to output a frequency comparison signal DIFF of a plurality of bits indicating the comparison result. When a difference between the frequencies of the reference clock CKB and the output clock CKO falls within a predetermined range, the frequency comparator 210 judges that the frequencies of the both clocks match with each other to output a frequency match signal MATCH.

The first control circuit 212 outputs a first selection signal SEL1 of a plurality of bits in synchronization with the first divided reference clock CKDB1, according to the frequency comparison signal DIFF.

Figure 7:
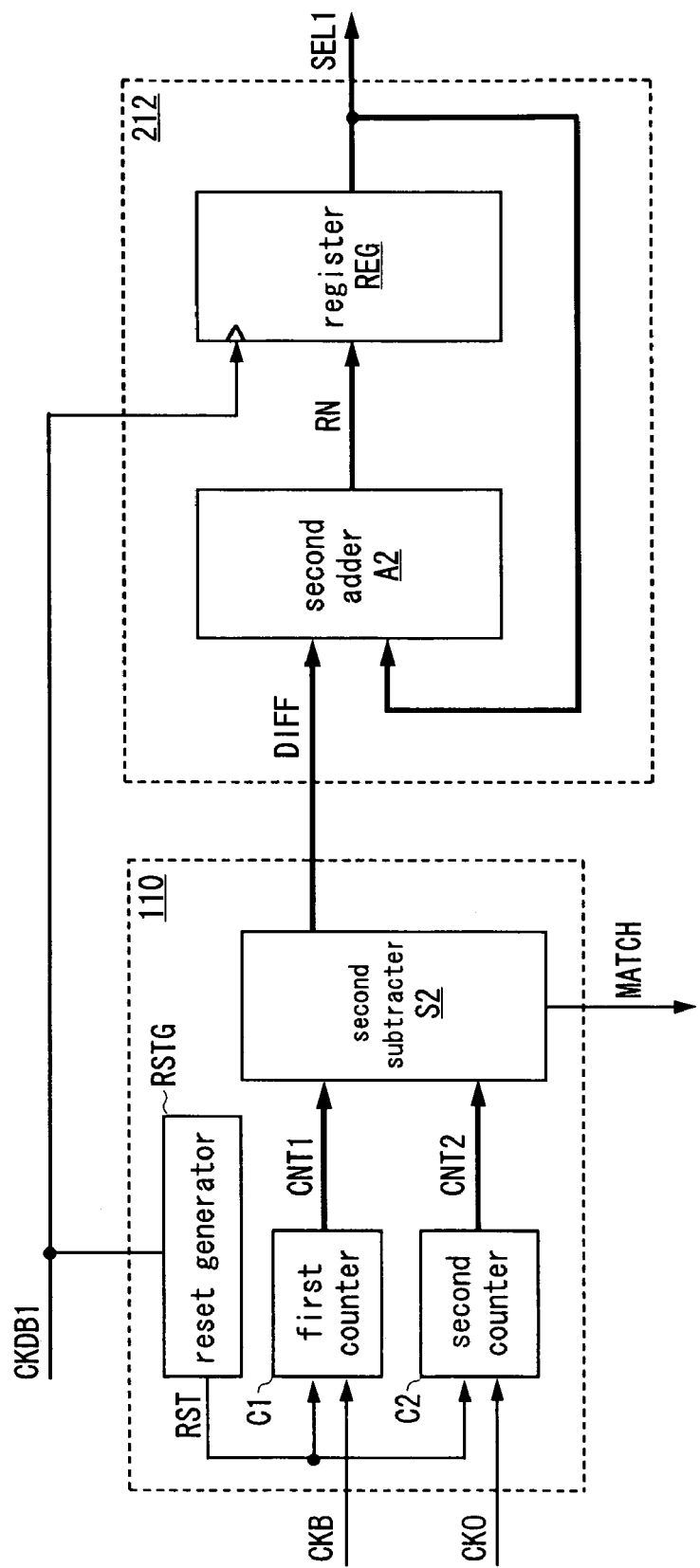
FIG. 7 is a block diagram showing details of a frequency comparator and a first control circuit according to the second embodiment.

FIG. 7 shows details of the frequency comparator 210 and the first control circuit 212 in the second embodiment.

The frequency comparator 210 has a second subtracter S2 in place of the magnitude comparator MC of the first embodiment. The other configuration is the same as that of the first embodiment.

The second subtracter S2 finds a difference between a first and a second counter value to output a found value as the frequency comparison signal DIFF.

The second subtracter S2 outputs the frequency match signal MATCH when the first and second counter values match with each other. The frequency match signal MATCH is generated by, for example, synchronizing a NOT signal of the logical sum of all the bits of the frequency comparison signal DFF with a rising edge of the first divided reference clock CKDB1. As in the first embodiment, when the first and second counter values match with each other, the frequency match signal MATCH is fixed to "logic 1". When the first and second counter values do not match with each other, the frequency match signal MATCH is fixed to "logic 0".

The first control circuit 212 has a second adder A2 and a register REG (a storage circuit).

The second adder A2 receives the frequency comparison signal DIFF and the first selection signal SEL1, adds a value indicated by the frequency comparison signal DIFF to a value indicated by the first selection signal SEL1, and outputs the addition result as an updated value signal RN.

The register REG receives the updated value signal RN in synchronization with the first divided reference clock CKDB1 to output a received value as the first selection signal SEL1. Consequently, a first selection circuit 118 shown in FIG. 5 is capable of switching an odd output signal ODD to be selected, by a plurality of stages at a time, according to the comparison result of the frequency comparator 210.

Further, before the frequency comparator 210 starts comparing the frequencies of the reference clock CKB and the output clock CKO, the register REG is set to a value corresponding to a buffer BUFn on a final stage and outputs in advance the first selection signal SEL1 indicating the buffer BUFn. In other words, the first selection circuit 118 selects an odd output signal ODDn in advance. Accordingly, the frequency of the output clock CKO is set in advance to the lowest frequency out of oscillatable frequencies.

Here, operations of the second embodiment will be briefly described, using a concrete example.

For example, the frequencies of the reference clock CKB and the output clock CKO are assumed to be 100 MHz (cycle: 10 ns) and 50 MHz (cycle: 20 ns) respectively. A division ratio of a first reference divider 150 is assumed to be $1/16$. That is, a cycle during which the frequencies of the reference clock CKB and the output clock CKO are compared is assumed to be 160 ns. A delay time per stage of the buffer BUF is assumed to be 0.1 ns. The first selection circuit 118 is assumed to select an $x^{th}$ odd output signal ODDx.

First, in order to make the frequency of the output clock CKO match the frequency of the reference clock CKB, the frequency of the output clock CKO is adjusted.

As in the first embodiment, in a first counter C1 and a second counter C2 in the frequency comparator 210, all bits are reset to "0" in response to a reset signal RST. Thereafter, the first counter C1 performs a counting operation on the reference clock CKB sixteen times before it is reset again. Therefore, a first counter value is counted up to "16". The second counter C2 performs a counting operation on the output clock CKO eight times before it is reset again. Therefore, a second counter value is counted up to "8". At this time the second subtracter S2 subtracts the first counter value from the second counter value to output the frequency comparison signal DIFF corresponding to the subtraction result (−8). Further, since the first and second counter values do not match with each other, the frequency match signal MATCH is fixed to "logic 0".

In the first control circuit 212, the second adder A2 adds the value indicated by the frequency comparison signal DIFF (−8) to the value indicated by the first selection signal SEL1 (x) to output the updated value signal RN corresponding to the addition result (x−8). The register REG receives the updated value signal RN in synchronization with the first divided reference clock CKDB1. That is, the value indicated by the first selection signal SEL1 is changed from x to (x−8).

The first selection circuit 118 switches the odd output signal ODD to be selected, from the odd output signal ODDx to an odd output signal ODDx−8. Accordingly, a cycle of the output clock CKO is reduced to 18.4 ns. That is, the frequency of the output clock CKO is heightened to about 54.35 MHz.

Repeating the frequency adjustment described above causes the first and second counter values to match with each other. Accordingly, the frequency of the output clock CKO matches the frequency of the reference clock CKB. That is, the frequency of the output clock CKO is locked. At this time, the frequency match signal MATCH is fixed to "logic 1".

After the frequency of the output clock CKO matches the frequency of the reference clock CKB, the phase of the output clock CKO is adjusted in order to make the phase of the output clock CKO match the phase of the reference clock CKB, as in the first embodiment.

Note that the frequency adjustment is still continued after the frequency of the output clock CKO matches the frequency of the reference clock CKB (including the period during the phase adjustment), as in the first embodiment. Therefore, when the frequency of the output clock CKO is deviated from the frequency of the reference clock CKB, the frequency adjustment of the output clock CKO as described above is made again. At this time, the frequency match signal MATCH changes from "logic 1" to "logic 0".

The second embodiment described above can also provide the same effects as those of the first embodiment. In addition, the value of the register REG is updated to the value equal to the sum of the value of the register REG and the difference between the first and second counter values, so that it is possible to switch the odd output signal ODD to be selected by the first selection circuit 118, not by one stage but by the plural stages at a time. As a result, it is possible to make the frequency of the output clock CKO match the frequency of the reference clock CKB in a shorter time.

Figure 8:
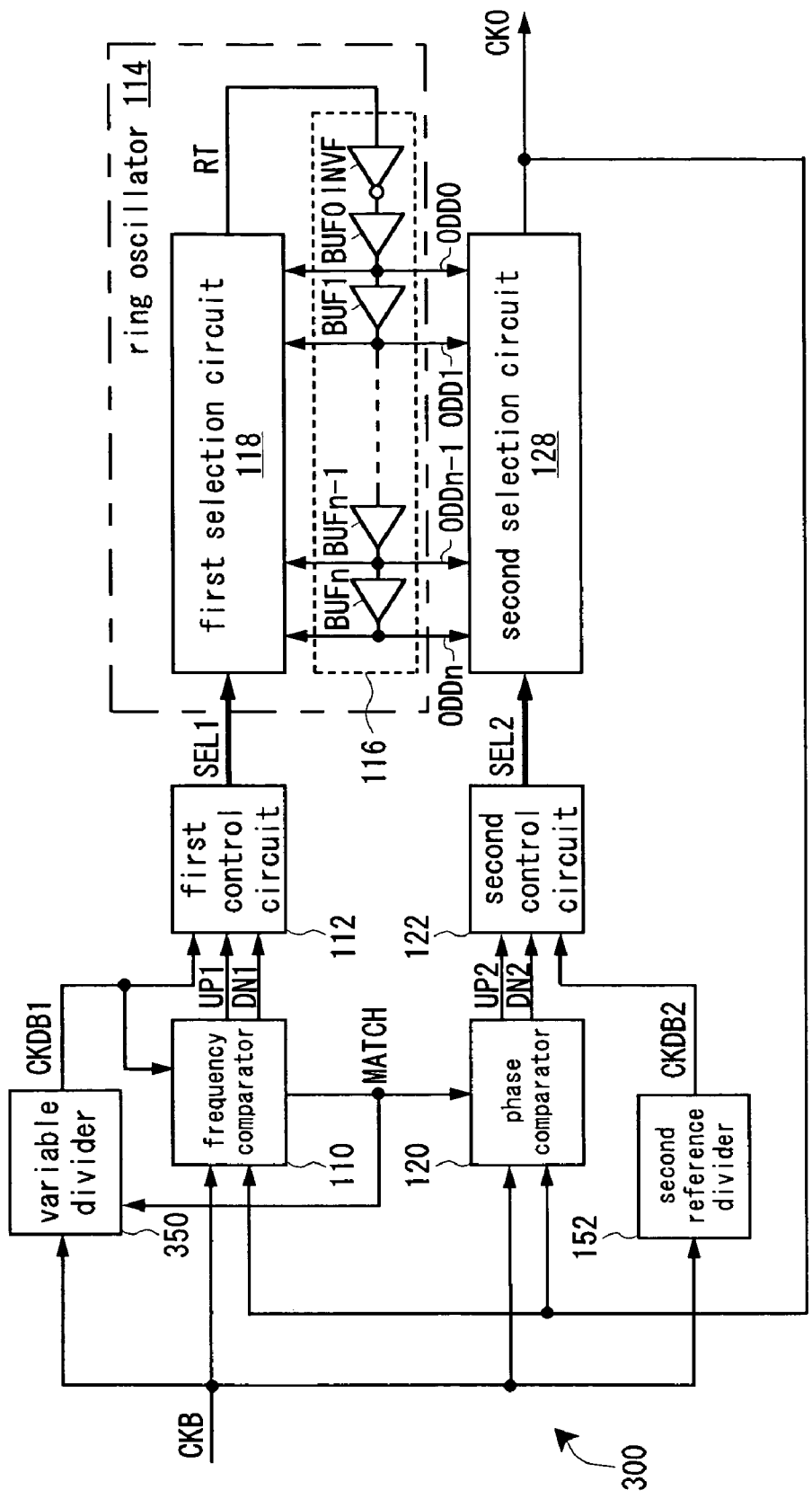
FIG. 8 is a block diagram showing a third embodiment of the digital PLL circuit of the present invention.

FIG. 8 shows a third embodiment of the digital PLL circuit of the present invention. The same reference numerals or symbols are used to designate the same elements as the elements described in the first embodiment, and detailed description thereof will be omitted.

A digital PLL circuit 300 has a variable divider 350 (a first reference divider) in place of the first reference divider 150 of the first embodiment. The other configuration is the same as that of the first embodiment.

The variable divider 350, similarly to the first reference divider 150 of the first embodiment, frequency-divides a reference clock CKB at a predetermined division ratio to output it as a first divided reference clock CKDB1. Further, the variable divider 350 sequentially increases a cycle of the first divided reference clock CKDB1 every time it receives a frequency match signal MATCH (high level). For example, the variable divider 350 sequentially changes the division ratio to $1/4$, $1/8$, $1/16$, . . . in synchronization with rising edges of the frequency match signal MATCH respectively.

At an initial stage of frequency adjustment of an output clock CKO, a difference between frequencies of the reference clock CKB and the output clock CKO is large, so that discrepancy between a first and a second counter value in a frequency comparator 110 is detectable in a short time (a small number of clocks). On the other hand, when the difference between the frequencies of the reference clock CKB and the output clock CKO is made smaller by the frequency adjustment, it takes a long time (a large number of clocks) to detect the discrepancy between the first and second counter values. Therefore, a period during which the frequencies of the reference clock CKB and the output clock CKO are compared (count period) is changed from a shorter period to a longer period in sequence, thereby improving accuracy of the frequency comparison in stages. Setting accuracy of the frequency comparison low at the initial stage causes the frequency of the output clock CKO to match the frequency of the reference clock CKB in a short time compared with a case where accuracy of the frequency comparison is not changed as in the first embodiment.

The third embodiment described above can also provide the same effects as those of the first embodiment. In addition, the period during which the frequencies of the reference clock CKB and the output clock CKO are compared is changed from a shorter period to a longer period in sequence, so that accuracy of the frequency comparison can be improved in stages. Accordingly, it is possible to make the frequency of the output clock CKO match the frequency of the reference clock CKB in a short time.

Figure 9:
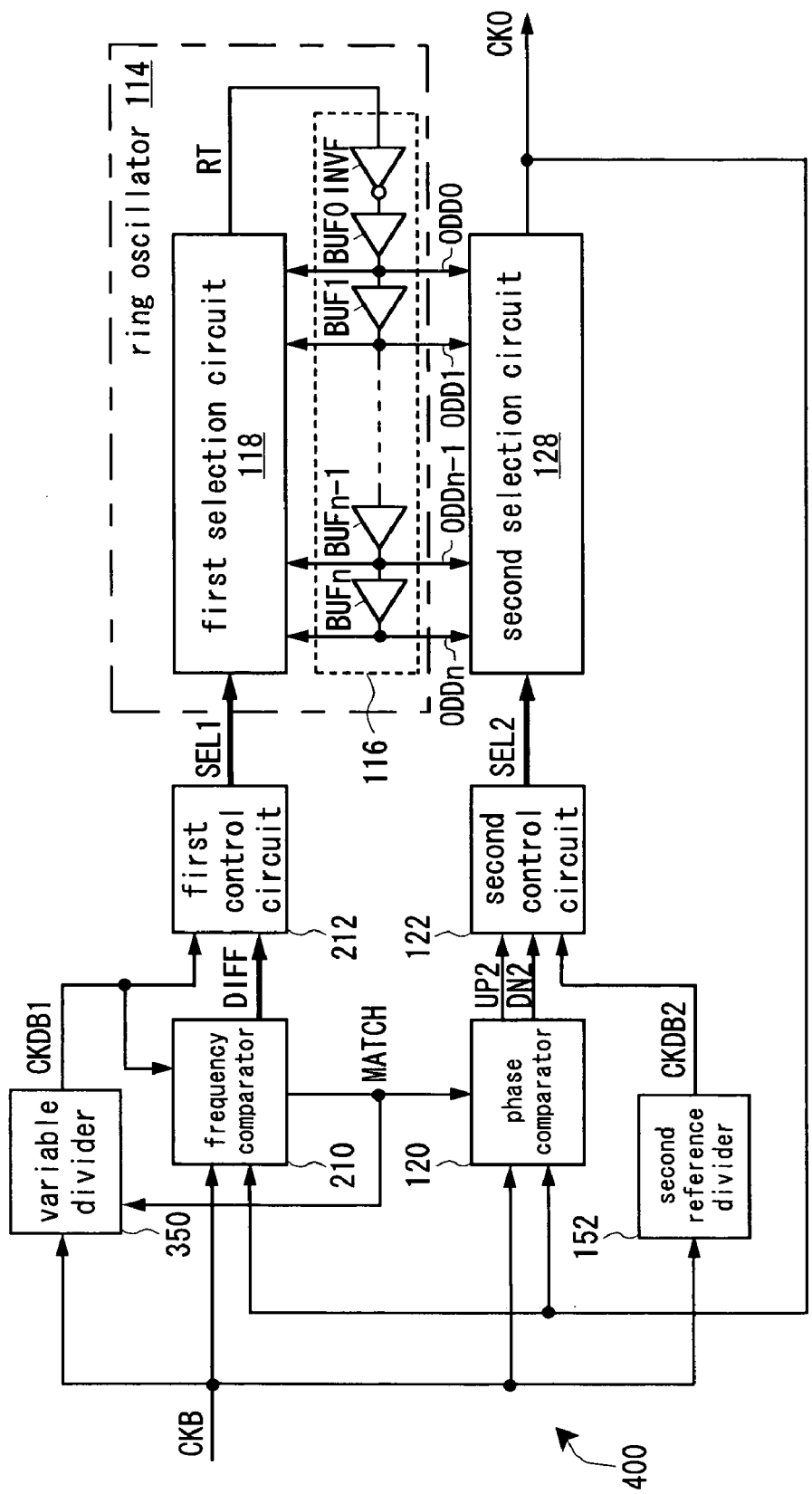
FIG. 9 is a block diagram showing a fourth embodiment of the digital PLL circuit of the present invention.

FIG. 9 shows a fourth embodiment of the digital PLL circuit of the present invention. The same reference numerals or symbols are used to designate the same elements as the elements described in the first, second, and third embodiments, and detailed description thereof will be omitted.

A digital PLL circuit 400 has a variable divider 350 (a first reference divider) in place of the first reference divider 150 of the second embodiment. The other configuration is the same as that of the second embodiment.

The fourth embodiment described above can also provide the same effects as those of the first, second and third embodiments.

Figure 10:
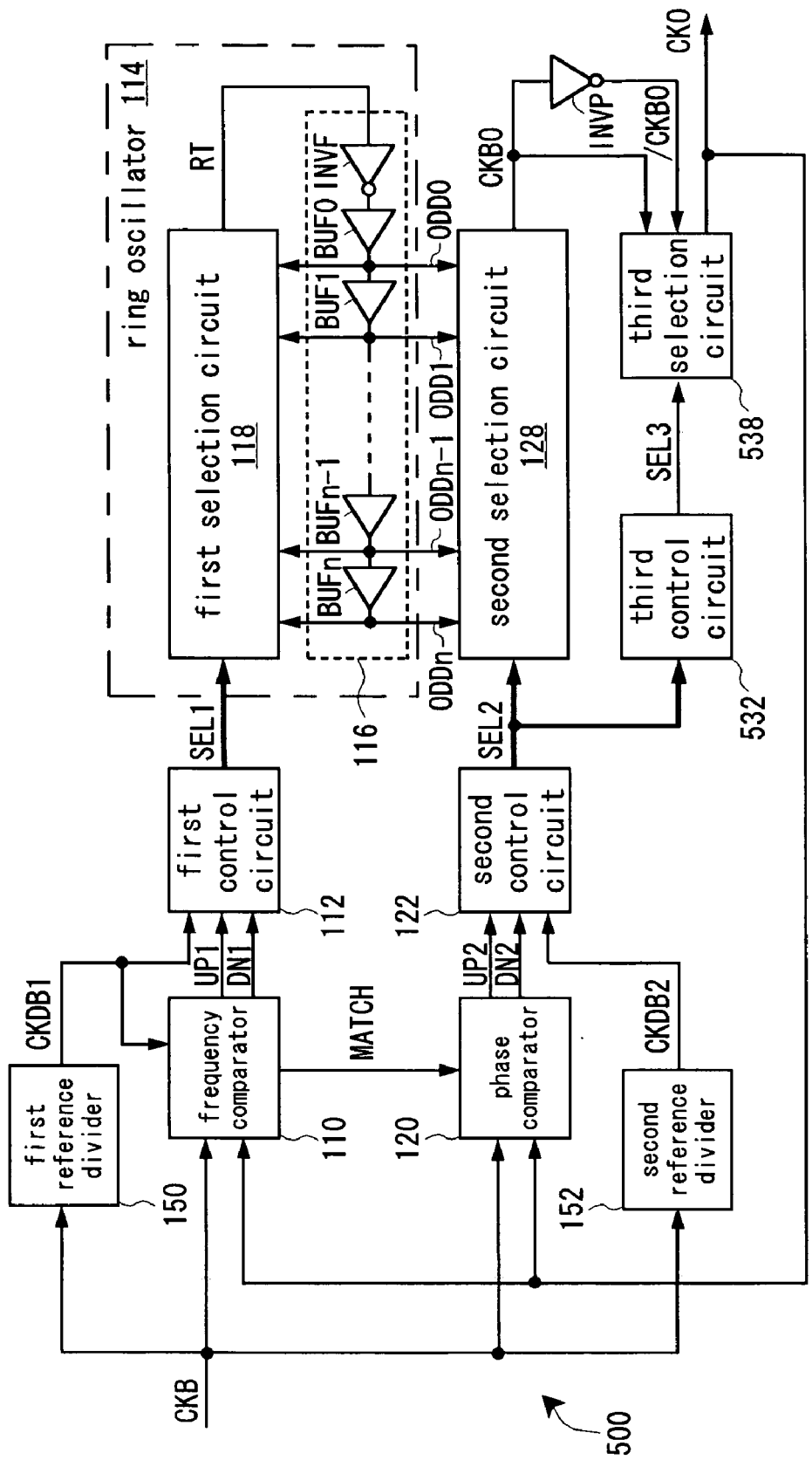
FIG. 10 is a block diagram showing a fifth embodiment of the digital PLL circuit of the present invention.

FIG. 10 shows a fifth embodiment of the digital PLL circuit of the present invention. The same reference numerals or symbols are used to designate the same elements as the elements described in the first embodiment, and detailed description thereof will be omitted.

A digital PLL circuit 500 is configured such that an inverter INVP, a third control circuit 532, and a third selection circuit 538 are added to the first embodiment. The other configuration is the same as that of the first embodiment.

The third control circuit 532 outputs a third selection signal SEL3 whose logic level is inverted when a counter value of a second up/down counter UDC2 (FIG. 4) indicated by a second selection signal SEL2 is changed from the maximum value to the minimum value and from the minimum value to the maximum value by a counting operation. For example, the maximum value and the minimum value of the counter value of the second up/down counter UDC2 are "n" and "0" respectively. For example, the third selection signal SEL3 is fixed to "logic 0" in advance.

The third selection circuit 538 alternately outputs an inverted output clock /CKBO and a reference output clock CKBO as an output clock CKO in response to transition edges (rising edges and falling edges) of the third selection signal SEL3. The inverted output clock /CKBO is generated by the inverter INVP inverting the reference output clock CKBO outputted from a second selection circuit 128. For example, the third selection circuit 538 outputs the reference output clock CKBO as the output clock CKO when the third selection signal SEL3 has "logic 1". The third selection circuit 538 outputs the inverted output clock /CKBO as the output clock CKO when the third selection signal SEL3 has "logic 0". Consequently, a phase of the output clock CKO is inverted in synchronization with the transition edges of the third selection signal SEL3.

In the fifth embodiment, the phase of the output clock CKO is inverted when the counter value of the second up/down counter UDC2 changes from the maximum value to the minimum value, so that the phase of the output clock CKO can be further delayed with respect to a phase corresponding to the maximum value of the counter value of the second up/down counter UDC2. Further, the phase of the output clock CKO is inverted when the counter value of the second up/down counter UDC2 changes from the minimum value to the maximum value, so that the phase of the output clock CKO can be set further ahead of a phase corresponding to the minimum value of the counter value of the second up/down counter UDC2.

The fifth embodiment described above can also provide the same effects as those of the first embodiment. In addition, the phase of the output clock CKO is inverted in response to the transition edges of the third selection signal SEL3, which allows wider-range adjustment of the phase of the output clock CKO.

Figure 11:
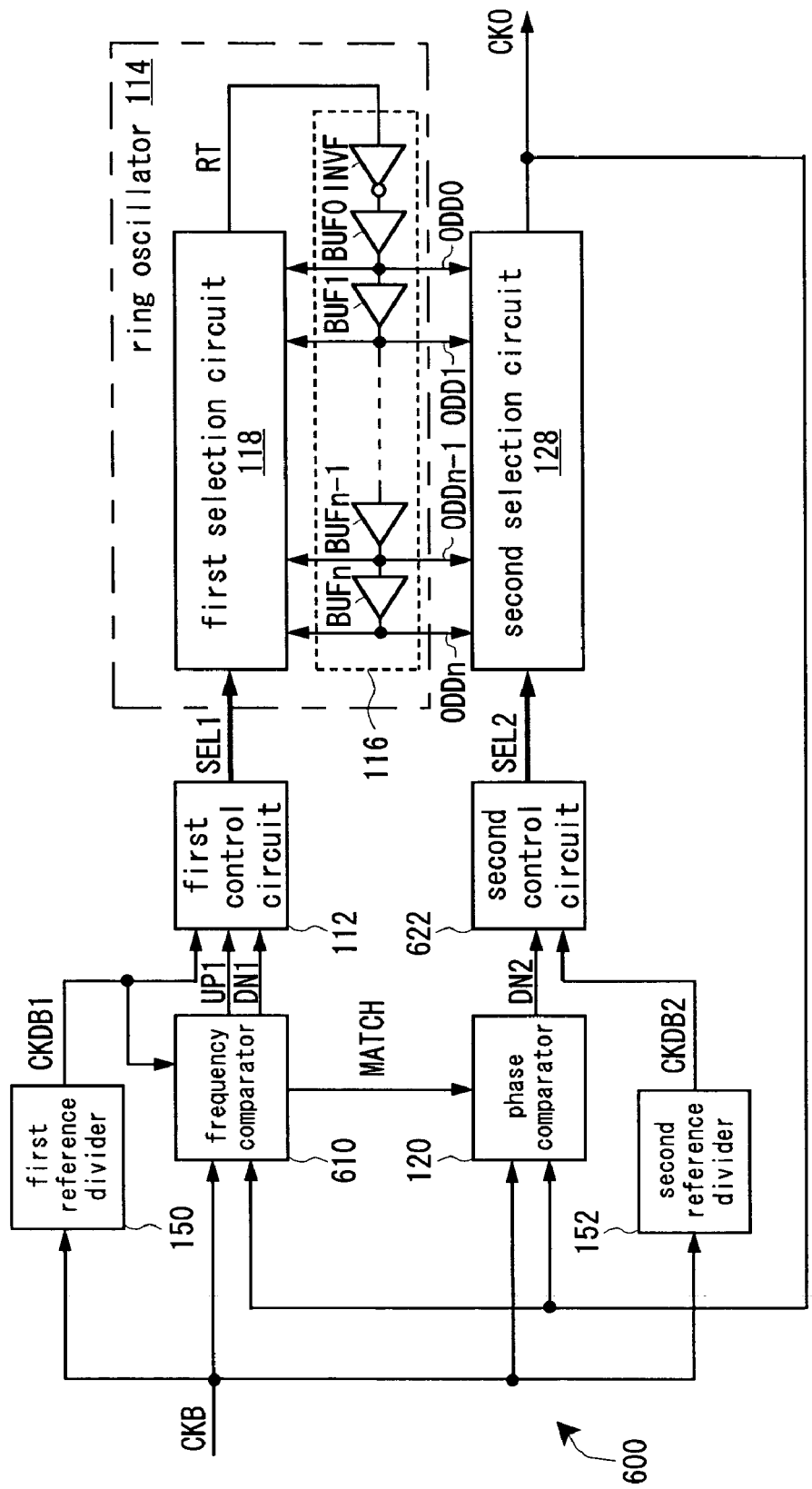
FIG. 11 is a block diagram showing a sixth embodiment of the digital PLL circuit of the present invention.

FIG. 11 shows a sixth embodiment of the digital PLL circuit of the present invention. The same reference numerals or symbols are used to designate the same elements as the elements described in the first embodiment, and detailed description thereof will be omitted.

A digital PLL circuit 600 has a frequency comparator 610 and a second control circuit 622 in place of the frequency comparator 110 and the second control circuit 122 of the first embodiment. The other configuration is the same as that of the first embodiment.

Figure 12:
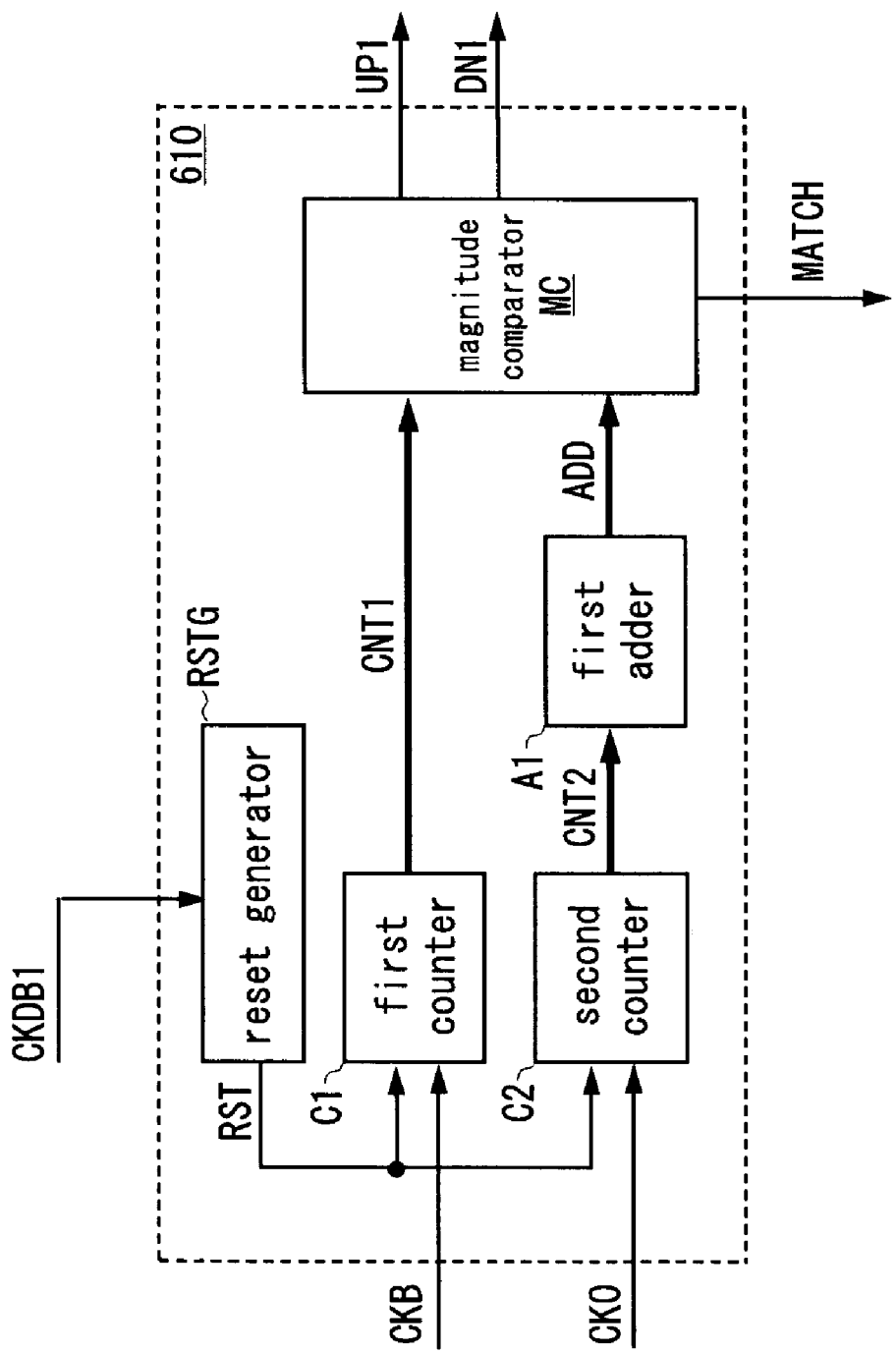
FIG. 12 is a block diagram showing details of a frequency comparator in the sixth embodiment.

FIG. 12 shows details of the frequency comparator 610 in the sixth embodiment.

The frequency comparator 610 is configured such that a first adder A1 is added in the frequency comparator 110 of the first embodiment. The other configuration is the same as that of the first embodiment.

The first adder A1 adds a predetermined value (for example, "1") to a second counter value of a second counter C2 to output the addition result as an addition value signal ADD of a plurality of bits.

A magnitude comparator MC receives the addition value signal ADD in place of a second counter value signal CNT2 indicating the second counter value. Consequently, when the magnitude comparator MC judges that the first and second counter values match with each other, a frequency of an output clock CKO is lower than a frequency of a reference clock CKB. Therefore, when the frequency of the output clock CKO is locked, the frequency of the output clock CKO never becomes higher than the frequency of the reference clock CKB. This prevents the frequency of the output clock CKO from oscillating across the frequency of the reference clock CKB when a cycle of the reference clock CKB is not dividable by a delay time per stage of a buffer BUF. As a result, jitter of the output clock CKO accompanying the frequency adjustment is reduced.

Figure 13:
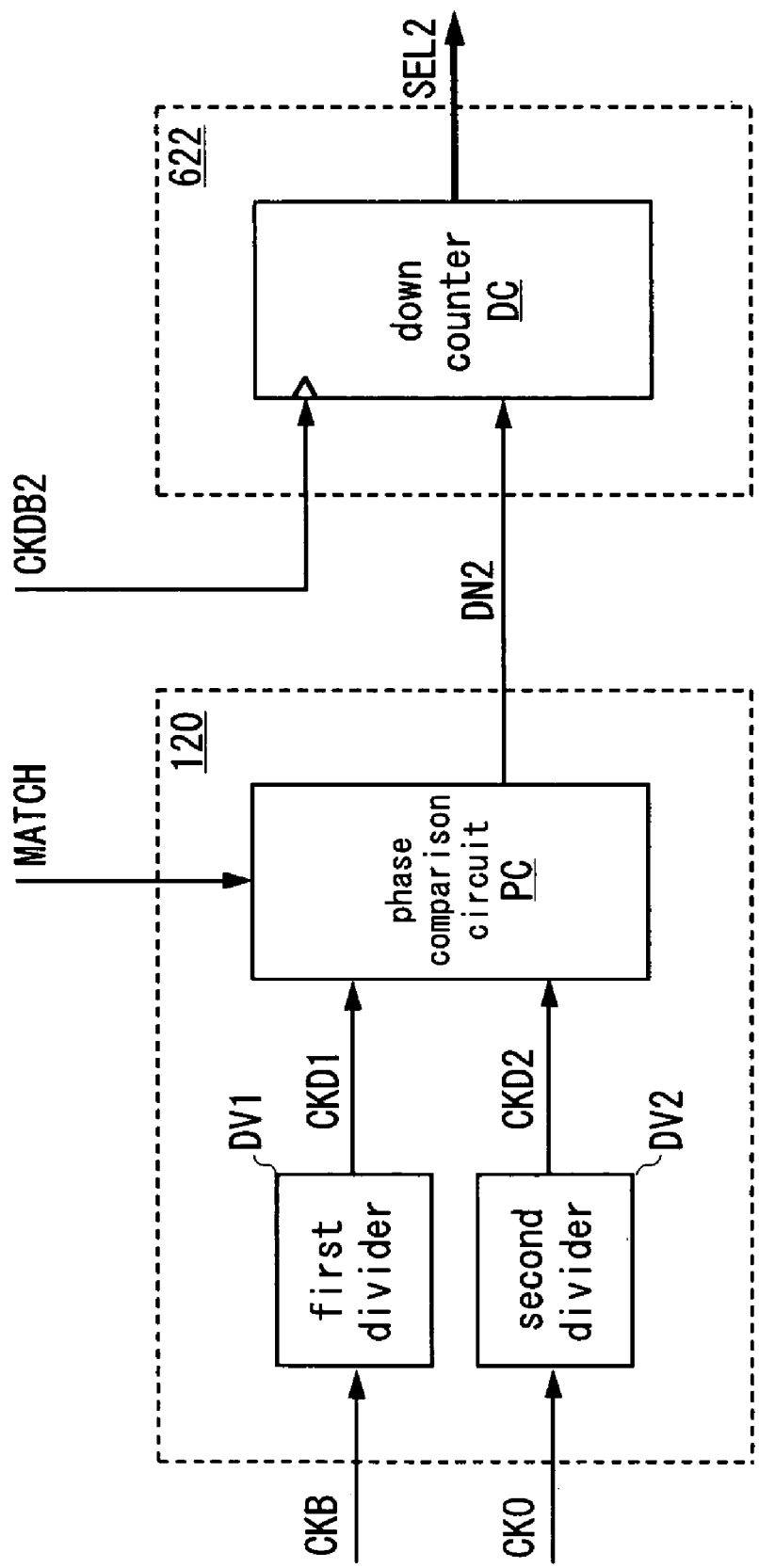
FIG. 13 is a block diagram showing details of a phase comparator and a second control circuit in the sixth embodiment.

FIG. 13 shows details of a phase comparator 120 and the second control circuit 622 in the sixth embodiment.

The second control circuit 622 has a down counter DC in place of the second up/down counter UDC2 of the first embodiment. The other configuration is the same as that of the first embodiment.

The down counter DC counts down according to a phase comparison signal DN2 in synchronization with a second divided reference clock CKDB2 to output a counted value as a second selection signal SEL2. For example, the down counter DC counts down in synchronization with rising edges of the second divided reference clock CKDB2 when the phase comparison signal DN2 has "logic 1". The down counter DC does not perform the counting operation when the phase comparison signal DN2 has "logic 0". Accordingly, a second selection circuit 128 switches an odd output signal ODD to be selected, by one stage at a time on a preceding stage side, according to the comparison result of the phase comparator 120.

Before the phase comparator 120 starts comparing phases of the reference clock CKB and the output clock CKO (for example, when a frequency match signal MATCH has "logic 0"), the down counter DC is set to a value corresponding to a buffer BUFn on a final stage to output in advance the second selection signal SEL2 indicating the buffer BUFn. That is, the second selection circuit 128 selects an odd output signal ODDn in advance. Accordingly, the phase of the output clock CKO is set in advance to the most delayed phase among adjustable phases.

In the digital PLL circuit 600 as configured above, when the frequency of the output clock CKO is locked, a cycle of the output clock CKO is necessarily larger than the cycle of the reference clock CKB. That is, the phase of the output clock CKO is gradually delayed every clock cycle at an instant when the frequency of the output clock CKO is locked. Consequently, after the phase of the output clock CKO once matches the phase of the reference clock CKB, the phase of the output clock CKO is necessarily deviated in a delay direction from the phase of the reference clock CKB. As a result, only with the adjustment of advancing the phase of the output clock CKO, it is possible to make the phase of the output clock CKO match the phase of the reference clock CKB. This allows the use of the down counter DC smaller in scale than the second up/down counter (FIG. 4) of the first embodiment in order to adjust the phase of the output clock CKO.

The sixth embodiment described above can also provide the same effects as those of the first embodiment. In addition, the frequency match is detected in the state where the frequency of the output clock CKO is higher than the frequency of the reference clock CKB, so that it is possible to reduce jitter of the output clock CKO that occurs due to the frequency adjustment. Moreover, when the frequency of the output clock CKO is locked, the cycle of the output clock CKO is necessarily larger than the cycle of the reference clock CKB, so that it is possible to make the phase of the output clock CKO match the phase of the reference clock CKB only with the adjustment of advancing the phase of the output clock CKO. This allows the use of the down counter DC smaller in scale in order to adjust the phase of the output clock CKO. As a result, a circuit scale can be reduced.

Figure 14:
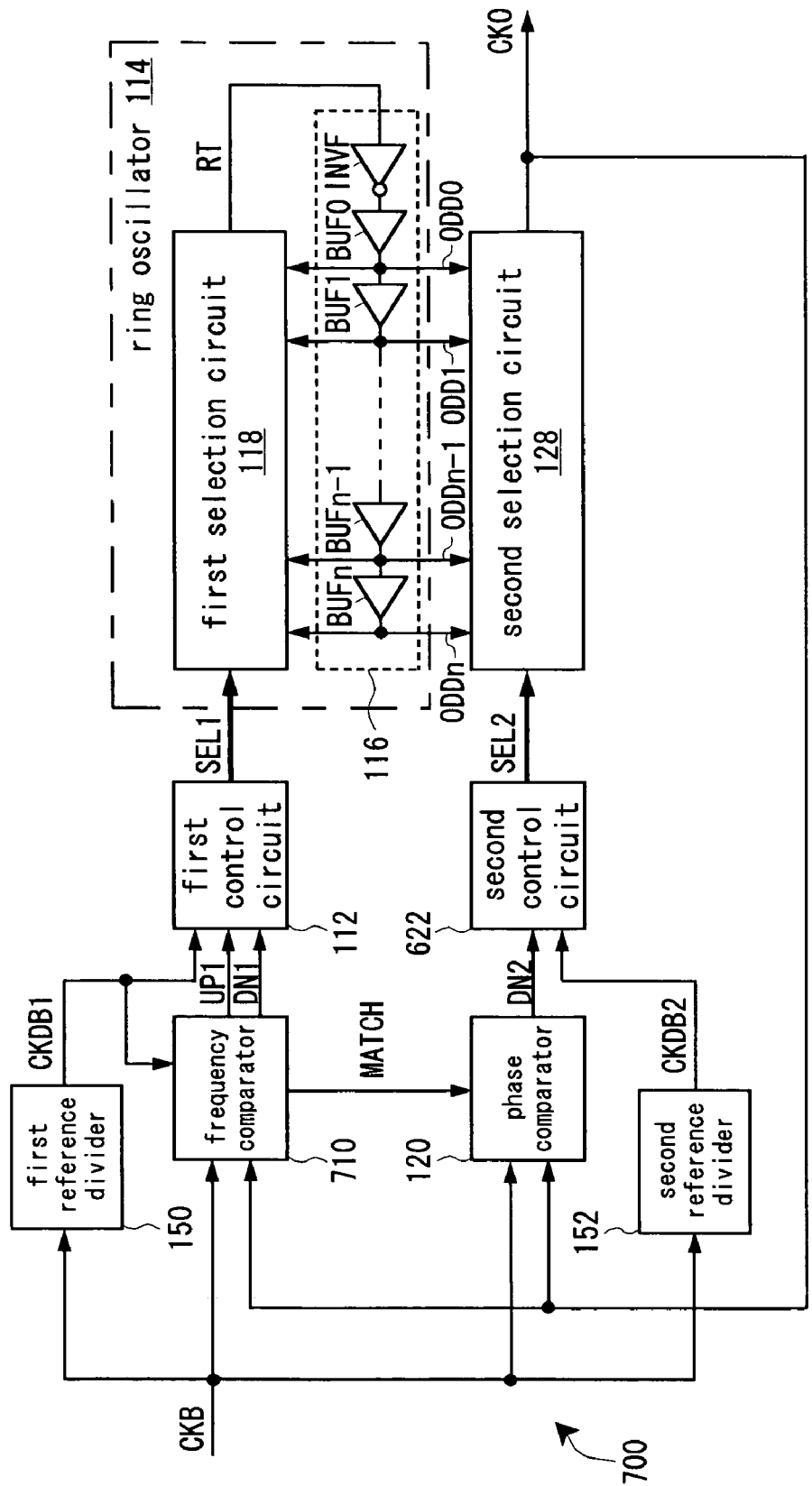
FIG. 14 is a block diagram showing a seventh embodiment of the digital PLL circuit of the present invention.

FIG. 14 shows a seventh embodiment of the digital PLL circuit of the present invention. The same reference numerals or symbols are used to designate the same elements as the elements described in the first and sixth embodiments, and detailed description thereof will be omitted.

A digital PLL circuit 700 has a frequency comparator 710 and the second control circuit 622 of the sixth embodiment in place of the frequency comparator 110 and the second control circuit 122 of the first embodiment. The other configuration is the same as that of the first embodiment.

Figure 15:
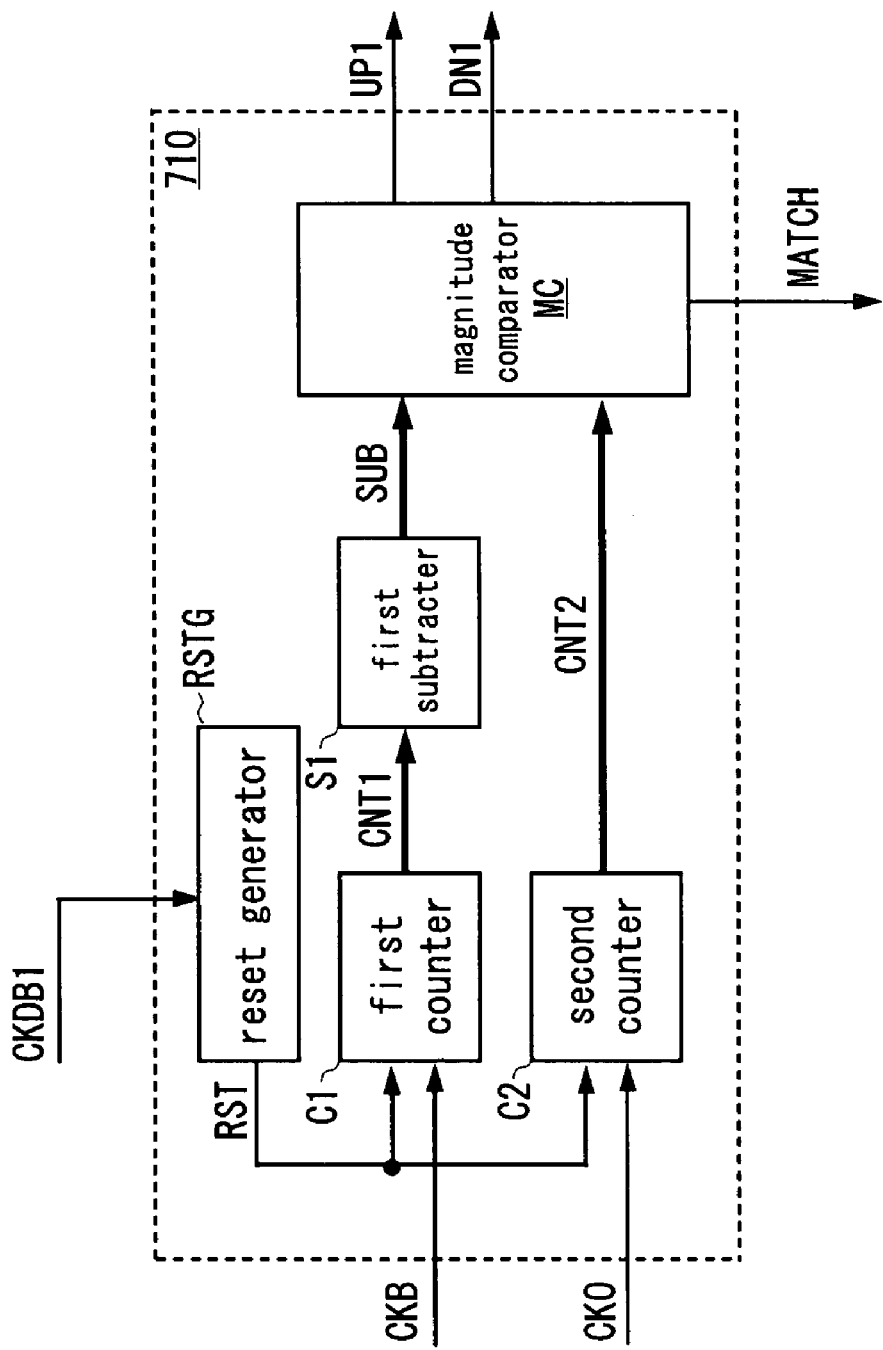
FIG. 15 is a block diagram showing details of a frequency comparator in the seventh embodiment.

FIG. 15 shows details of the frequency comparator 710 in the seventh embodiment.

The frequency comparator 710 is configured such that a first subtracter S1 is added in the frequency comparator 110 of the first embodiment. The other configuration is the same as that of the first embodiment.

The first subtracter S1 subtracts a predetermined value (for example, "1") from a first counter value of a first counter C1 to output the subtraction result as a subtraction value signal SUB of a plurality of bits.

A magnitude comparator MC receives the subtraction value signal SUB in place of a first counter value signal CNT1 indicating the first counter value. Consequently, as in the sixth embodiment, when the magnitude comparator MC judges that the first and second counter values match with each other, a frequency of an output clock CKO is lower than a frequency of a reference clock CKB. Therefore, when the frequency of the output clock CKO is locked, the frequency of the output clock CKO never becomes higher than the frequency of the reference clock CKB. This prevents the frequency of the output clock CKO from oscillating across the frequency of the reference clock when a cycle of the reference clock CKB is not dividable by a delay time per stage of a buffer BUF. As a result, jitter of the output clock CKO accompanying the frequency adjustment is reduced.

The seventh embodiment described above can also provide the same effects as those of the first and sixth embodiments.

Figure 16:
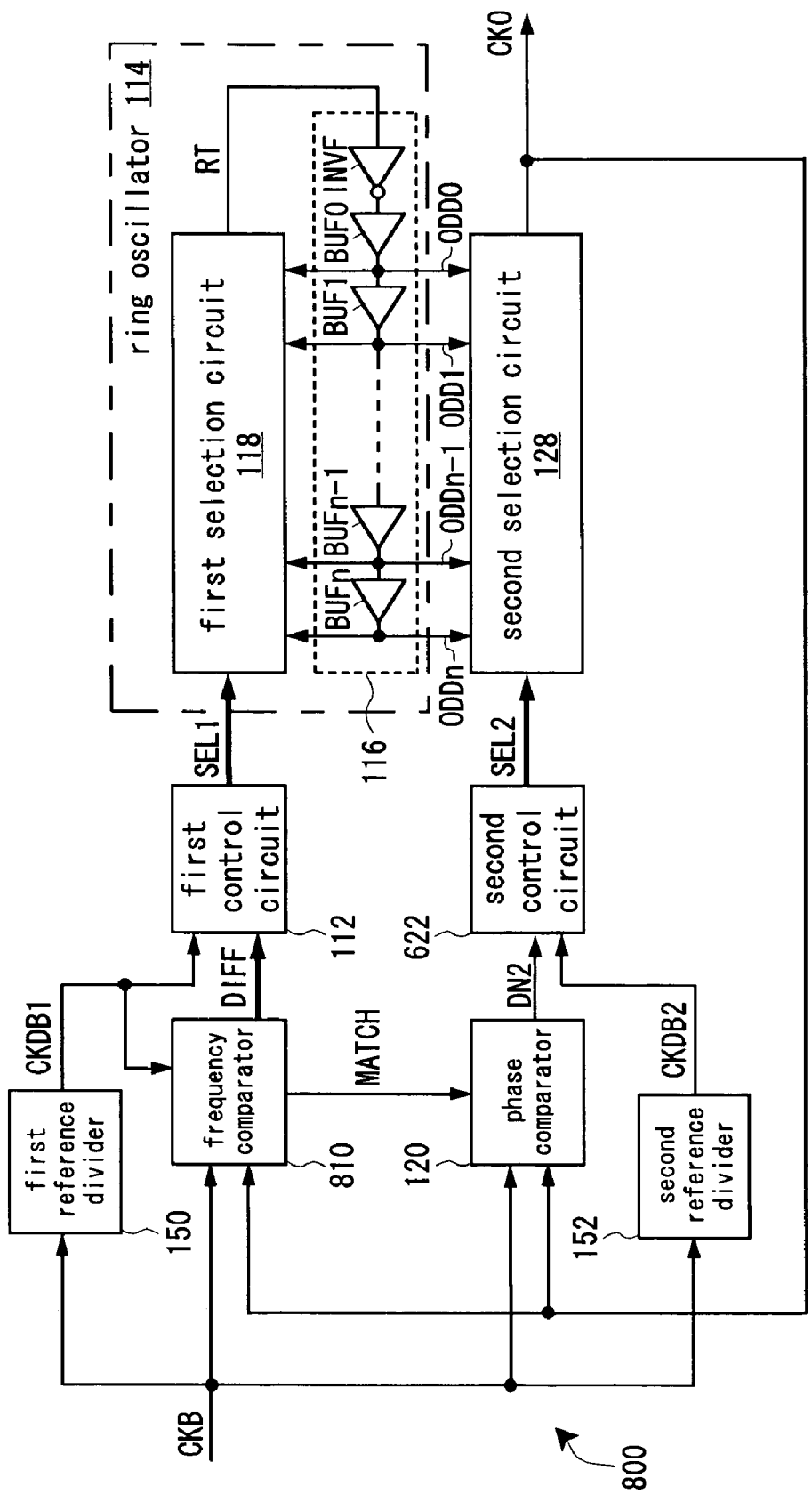
FIG. 16 is a block diagram showing an eighth embodiment of the digital PLL circuit of the present invention.

FIG. 16 shows an eighth embodiment of the digital PLL circuit of the present invention. The same reference numerals or symbols are used to designate the same elements as the elements described in the first, second, and sixth embodiments, and detailed description thereof will be omitted.

A digital PLL circuit 800 has a frequency comparator 810 and the second control circuit 622 of the sixth embodiment in place of the frequency comparator 210 and the second control circuit 122 of the second embodiment. The other configuration is the same as that of the second embodiment.

Figure 17:
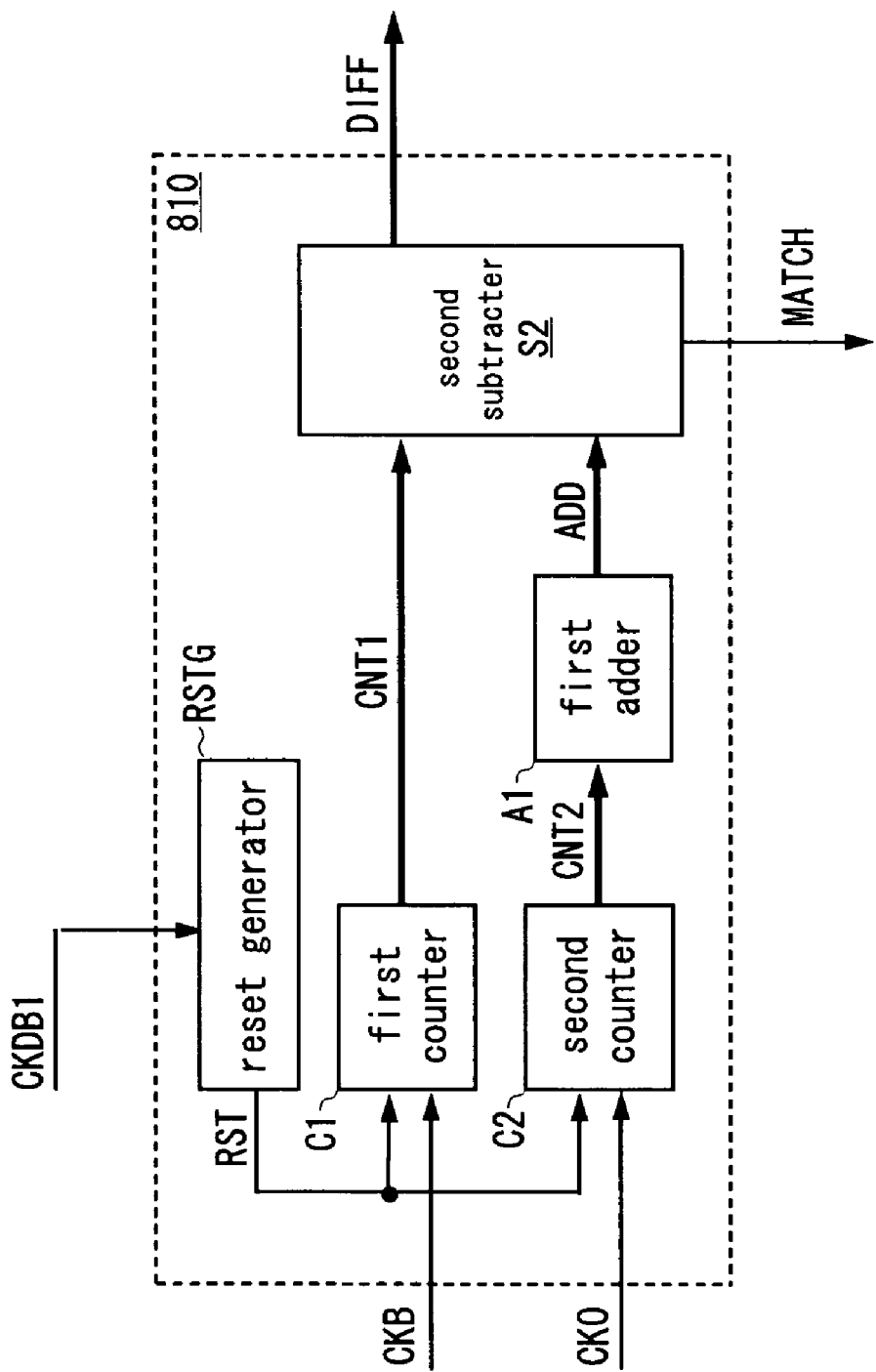
FIG. 17 is a block diagram showing details of a frequency comparator according to the eighth embodiment.

FIG. 17 shows details of the frequency comparator 810 in the eighth embodiment.

The frequency comparator 810 is configured such that a first adder A1 is added in the frequency comparator 210 of the second embodiment. The other configuration is the same as that of the second embodiment.

The first adder A1 adds a predetermined value (for example, "1") to a second counter value of a second counter C2 to output the addition result as an addition value signal ADD of a plurality of bits.

A second subtracter S2 receives the addition value signal ADD in place of a second counter value signal CNT2 indicating the second counter value. Consequently, when the second subtracter S2 judges that the first and second counter values match with each other, a frequency of an output clock CKO is lower than a frequency of a reference clock CKB. Therefore, when the frequency of the output clock CKO is locked, the frequency of the output clock CkO never becomes higher than the frequency of the reference clock CKB. This prevents the frequency of the output clock CKO from oscillating across the frequency of the reference clock CKB when a cycle of the reference clock CKB is not dividable by a delay time per stage of a buffer BUF. As a result, jitter of the output clock CKO accompanying the frequency adjustment is reduced.

The eighth embodiment described above can also provide the same effects as those of the first, second, and sixth embodiments.

Figure 18:
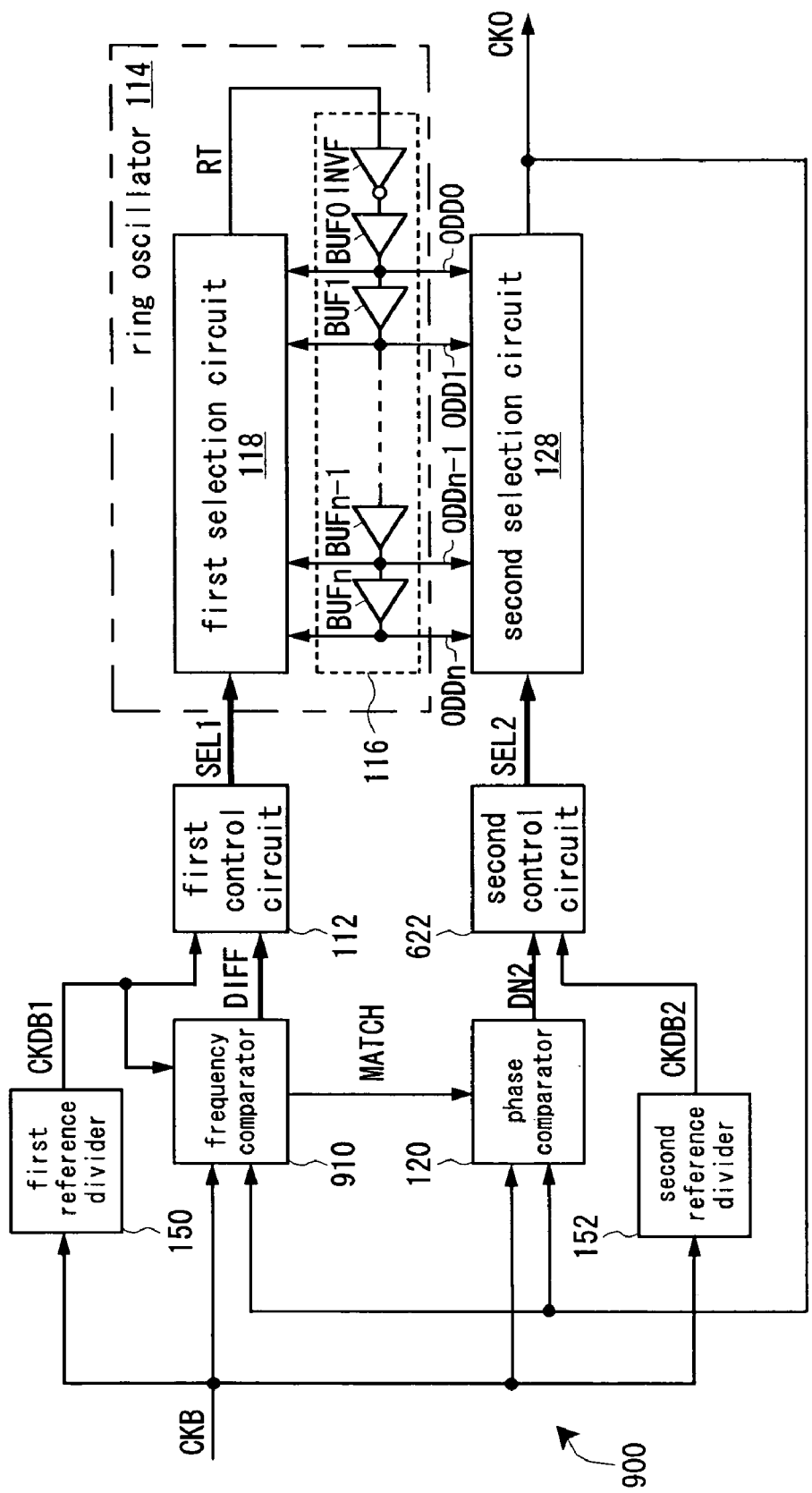
FIG. 18 is a block diagram showing a ninth embodiment of the digital PLL circuit of the present invention.

FIG. 18 shows a ninth embodiment of the digital PLL circuit of the present invention. The same reference numerals or symbols are used to designate the same elements as the elements described in the first, second, and sixth embodiments, and detailed description thereof will be omitted.

A digital PLL circuit 900 has a frequency comparator 910 and the second control circuit 622 of the sixth embodiment in place of the frequency comparator 210 and the second control circuit 122 of the second embodiment. The other configuration is the same as that of the second embodiment.

Figure 19:
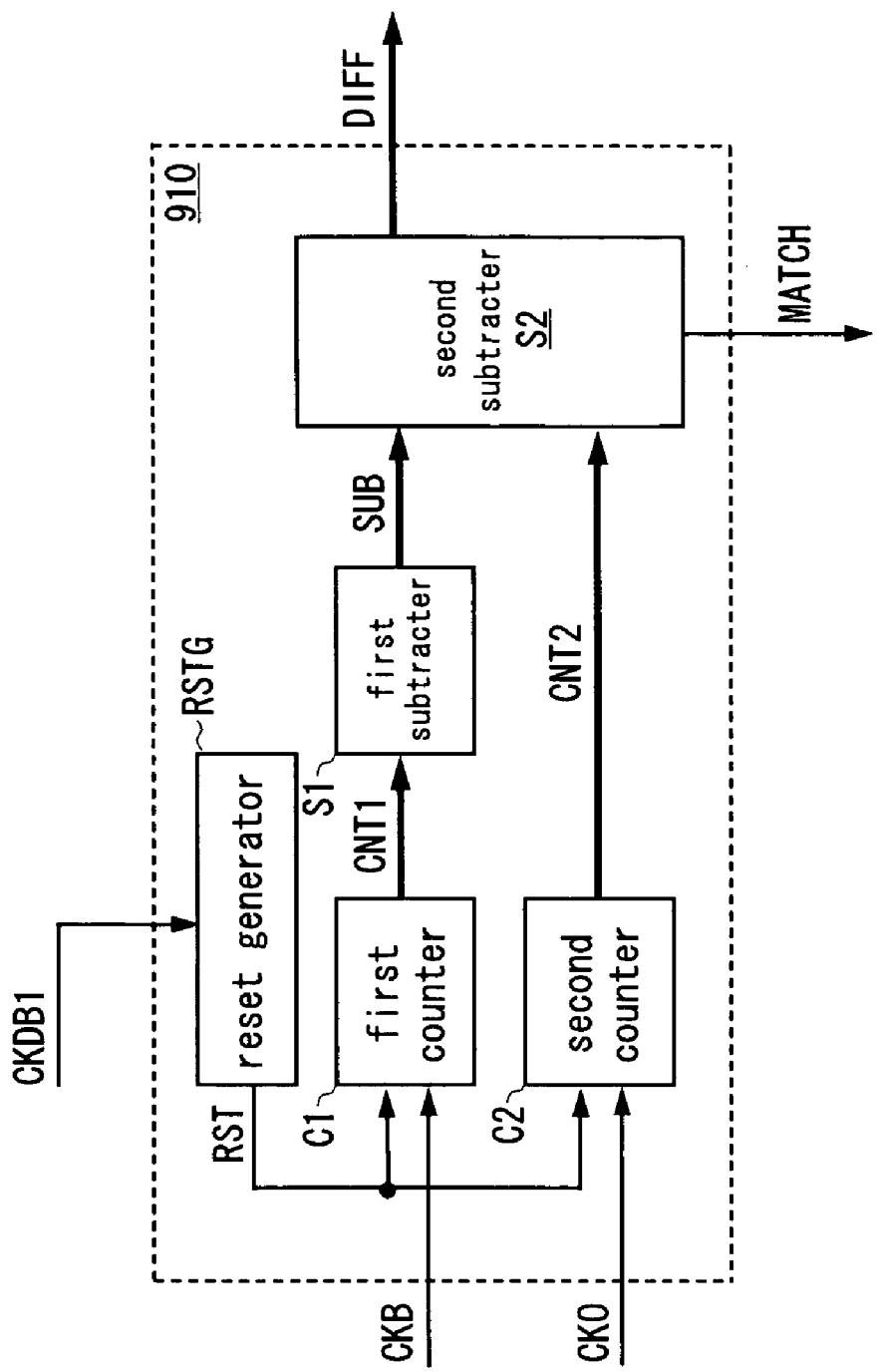
FIG. 19 is a block diagram showing details of a frequency comparator in the ninth embodiment.

FIG. 19 shows details of the frequency comparator 910 in the ninth embodiment.

The frequency comparator 910 is configured such that a first subtracter S1 is added in the frequency comparator 210 of the second embodiment. The other configuration is the same as that of the second embodiment.

The first subtracter S1 subtracts a predetermined value (for example, "1") from a first counter value of a first counter C1 to output the subtraction result as a subtraction value signal SUB of a plurality of bits.

A second subtracter S2 receives the subtraction value signal SUB in place of a first counter value signal CNT1 indicating the first counter value. Consequently, as in the eighth embodiment, when the second subtracter S2 judges that the first and second counter values match with each other, a frequency of an output clock CKO is lower than a frequency of a reference clock CKB. Therefore, when the frequency of the output clock CKO is locked, the frequency of the output clock CkO never becomes higher than the frequency of the reference clock CKB. This prevents the frequency of the output clock CKO from oscillating across the frequency of the reference clock CKB when a cycle of the reference clock CKB is not dividable by a delay time per stage of a buffer BUF. As a result, jitter of the output clock CKO accompanying the frequency adjustment is reduced.

The ninth embodiment described above can also provide the same effects as those of the first, second and sixth embodiments.

Figure 20:
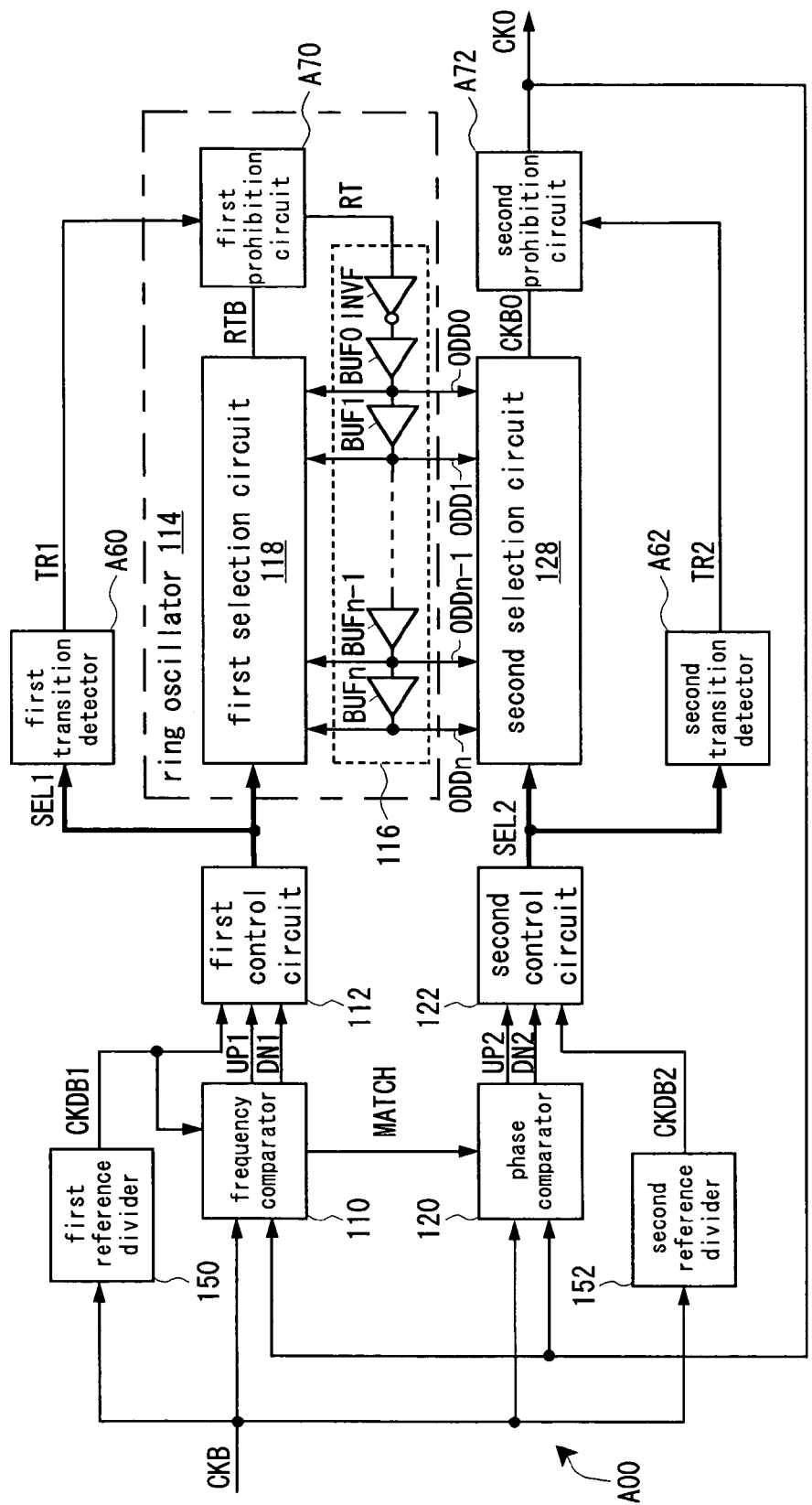
FIG. 20 is a block diagram showing a tenth embodiment of the digital PLL circuit of the present invention.

FIG. 20 shows a tenth embodiment of the digital PLL circuit of the present invention. The same reference numerals or symbols are used to designate the same elements as the elements described in the first embodiment, and detailed description thereof will be omitted.

A digital PLL circuit A00 is configured such that a first transition detector A60, a second transition detector A62, a first prohibition circuit A70, and a second prohibition circuit A72 are added to the first embodiment. The other configuration is the same as that of the first embodiment.

The first transition detector A60 outputs a first transition signal TR1 during a transitional period of a first selection signal SEL1. For example, the first transition detector A60 detects transition edges of respective bits of the first selection signal SEL1 ascribable to frequency adjustment and fixes the first transition signal TR1 to "logic 1" in the transitional period of the first selection signal SEL1. The first transition signal TR1 is fixed to "logic 0" in a period during which the first selection signal SEL1 is fixed.

The second transition detector A62 outputs a second transition signal TR2 during a transitional period of a second selection signal SEL2. For example, the second transition detector A62 detects transition edges of respective bits of the second selection signal SEL2 ascribable to phase adjustment, and fixes the second transition signal TR2 to "logic 1" in the transitional period of the second selection signal SEL2. The second transition signal TR2 is fixed to "logic 0" in a period during which the second selection signal SEL2 is fixed.

The first prohibition circuit A70 is disposed between an output of a first selection circuit 118 and an input of a delay circuit 116 and it prohibits a reference feedback signal RTB outputted from the first selection circuit 118 from propagating to the delay circuit 116 while the first transition signal TR1 is being outputted (the period during which the first transition signal TR1 has "logic 1"). For example, the first prohibition circuit A70 is a through latch that latches the reference feedback signal RTB in synchronization with rising edges of the first transition signal TR1 to output a feedback signal RT. Specifically, the first prohibition circuit A70 outputs the reference feedback signal RTB as the feedback signal RT in the period during which the first transition signal TR1 has "logic 0". In the period during which the first transition signal TR1 has "logic 1", the first prohibition circuit A70 keeps outputting as the feedback signal RT a logic level of the reference feedback signal RTB that is latched in synchronization with the rising edges of the first transition signal TR1. Consequently, even if a hazard or the like occurs in the reference feedback signal RTB due to the transition of the first selection signal SEL1, it does not propagate to the feedback signal RT. As a result, the occurrence of the hazard or the like in the output clock CKO is prevented.

The second prohibition circuit A72 is disposed between an output of a second selection circuit 128 and inputs of a frequency comparator 110 and a phase comparator 120 and it prohibits a reference output clock CKBO outputted from the second selection circuit 128 from propagating to the frequency comparator 110 and the phase comparator 120 while the second transition signal TR2 is being outputted (the period during which the second transition signal TR2 has "logic 1"). For example, the second prohibition circuit A72 is a through latch that latches the reference output clock CKBO in synchronization with rising edges of the second transition signal TR2 to output the output clock CKO. Specifically, in the period during which the second transition signal TR2 has "logic 0", the second prohibition circuit A72 outputs the reference output clock CKBO as the output clock CKO. In the period during which the second transition signal has "logic 1", the second prohibition circuit A72 keeps outputting as the output clock CKO a logic level of the reference output clock CKBO that is latched in synchronization with the rising edges of the second transition signal TR2. Consequently, even if a hazard or the like occurs in the reference output clock CKBO due to the transition of the second selection signal SEL2, it does not propagate to the output clock CKO. As a result, the occurrence of the hazard or the like in the output clock CKO is prevented.

The tenth embodiment described above can also provide the same effects as those of the first embodiment. In addition, the first prohibition circuit A70 prohibits the output of the first selection circuit 118 from propagating to the delay circuit 116 during the transitional period of the first selection signal SEL1, so that the occurrence of the hazard or the like in the output clock CKO due to the transition of the first selection signal SEL1 can be prevented. The second prohibition circuit A72 prohibits the output of the second selection circuit 128 from propagating to the frequency comparator 110 and the phase comparator 120 during the transitional period of the second selection signal SLE2, so that the occurrence of the hazard or the like in the output clock CKO due to the transition of the second selection signal SEL2 can be prevented.

Figure 21:
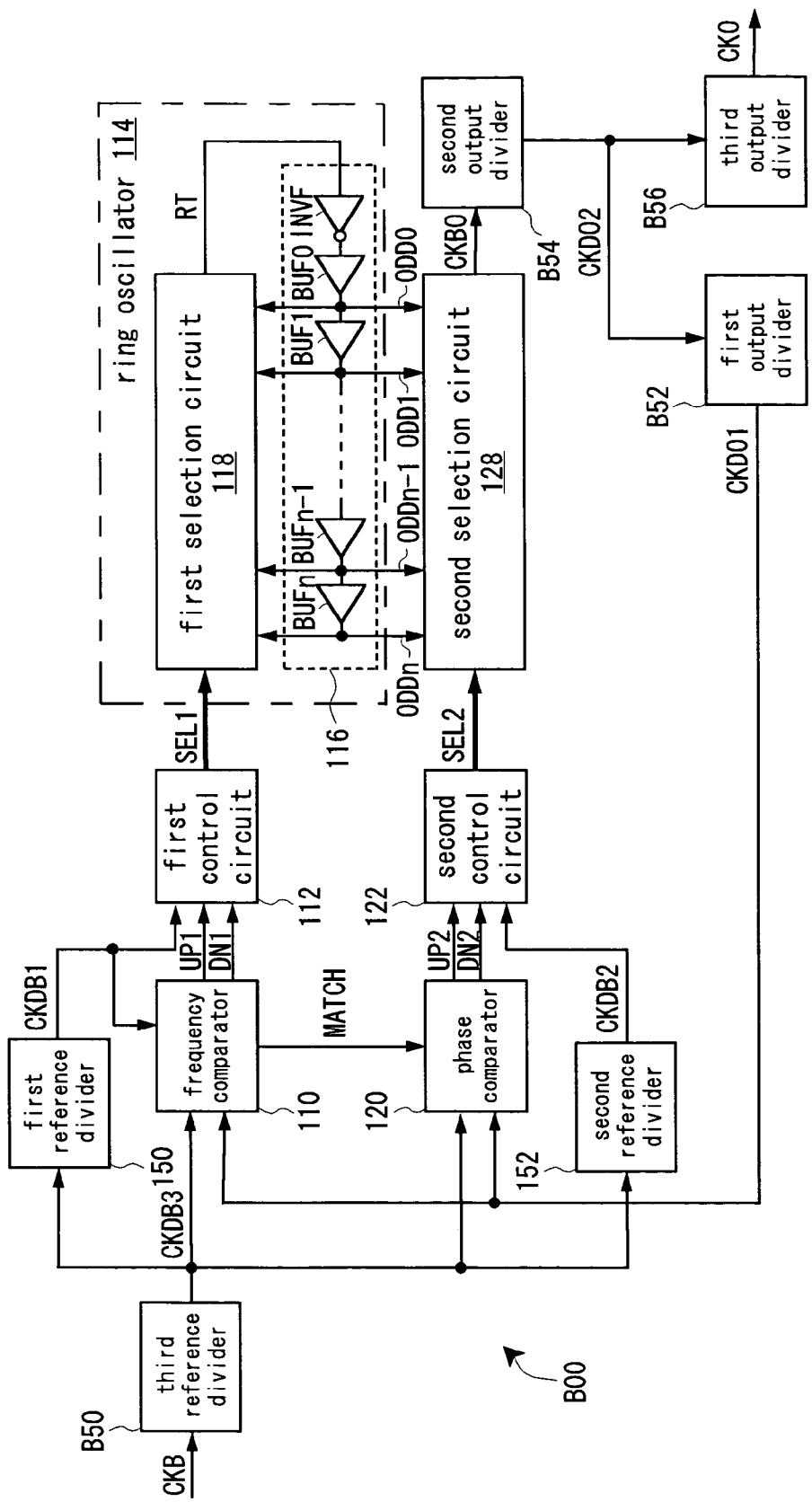
FIG. 21 is a block diagram showing an eleventh embodiment of the digital PLL circuit of the present invention.

FIG. 21 shows an eleventh embodiment of the digital PLL circuit of the present invention. The same reference numerals or symbols are used to designate the same elements as the elements described in the first embodiment, and detailed description thereof will be omitted.

A digital PLL circuit B00 is configured such that a third reference divider B50, a first output divider B52, a second output divider B54, and a third output divider B56 are added to the first embodiment. The other configuration is the same as that of the first embodiment.

The third reference divider B50 frequency-divides a reference clock CKB at a predetermined division ratio (for example, 1/K) to output it as a third divided reference clock CKDB3.

The second output divider B54 frequency-divides a reference output clock CKBO outputted from a second selection circuit 128 at a predetermined division ratio (for example, 1/M) to output it as a second divided output clock CKDO2.

The first output divider B52 frequency-divides the second divided output clock CKDO2 at a predetermined division ratio (for example, 1/L) to output it as a first divided output clock CKDO1).

The third output divider B56 frequency-divides the second divided output clock CKDO2 at a predetermined division ratio (for example, 1/N) to output it as an output clock CKO.

A frequency comparator 110, a phase comparator 120, a first reference divider 150 and a second reference divider 152 receive the third reference clock CKDB3 in place of the reference clock CKB of the first embodiment. The frequency comparator 110 and the phase comparator 120 receive the first divided output clock CKDO1 in place of the output clock CKO of the first embodiment.

For example, a frequency of the reference clock CKB is defined as "f". In a state where a frequency of the output clock CKO is locked (in a case where a frequency match signal MATCH has "logic 1"), frequencies of the third divided reference clock CKDB3 and the first divided output clock CKDO1 are both f/K. At this time, frequencies of the reference output clock CKBO, the second output divided clock CKDO2, and the output clock CKO are f×L/K, f×(L×M)/K, f×(L×M)/(K×N) respectively. Therefore, when L×M<K×N holds, the output clock CKO is frequency-divided. When L×M>K×N holds, the output clock CKO is multiplied.

The eleventh embodiment described above can also provide the same effects as those of the first embodiment. In addition, the third reference divider B50, the first output divider B52, the second output divider B54, and the third output divider B56 are formed in the digital PLL circuit B00, so that the output clock CKO with a predetermined division ratio or multiplication ratio with respect to the reference clock CKB can be easily generated. Further, by designing the third reference divider B50, the first output dividerB52, the second output divider B54, and the third output divider B56 so that L×M=K×N holds, it is possible to make the frequency and phase of the output clock CKO match the frequency and phase of the reference clock CKB respectively even when the frequency of the reference clock CKB is higher than an upper limit of frequencies comparable by the frequency comparator 110 and the phase comparator 120.

Figure 22:
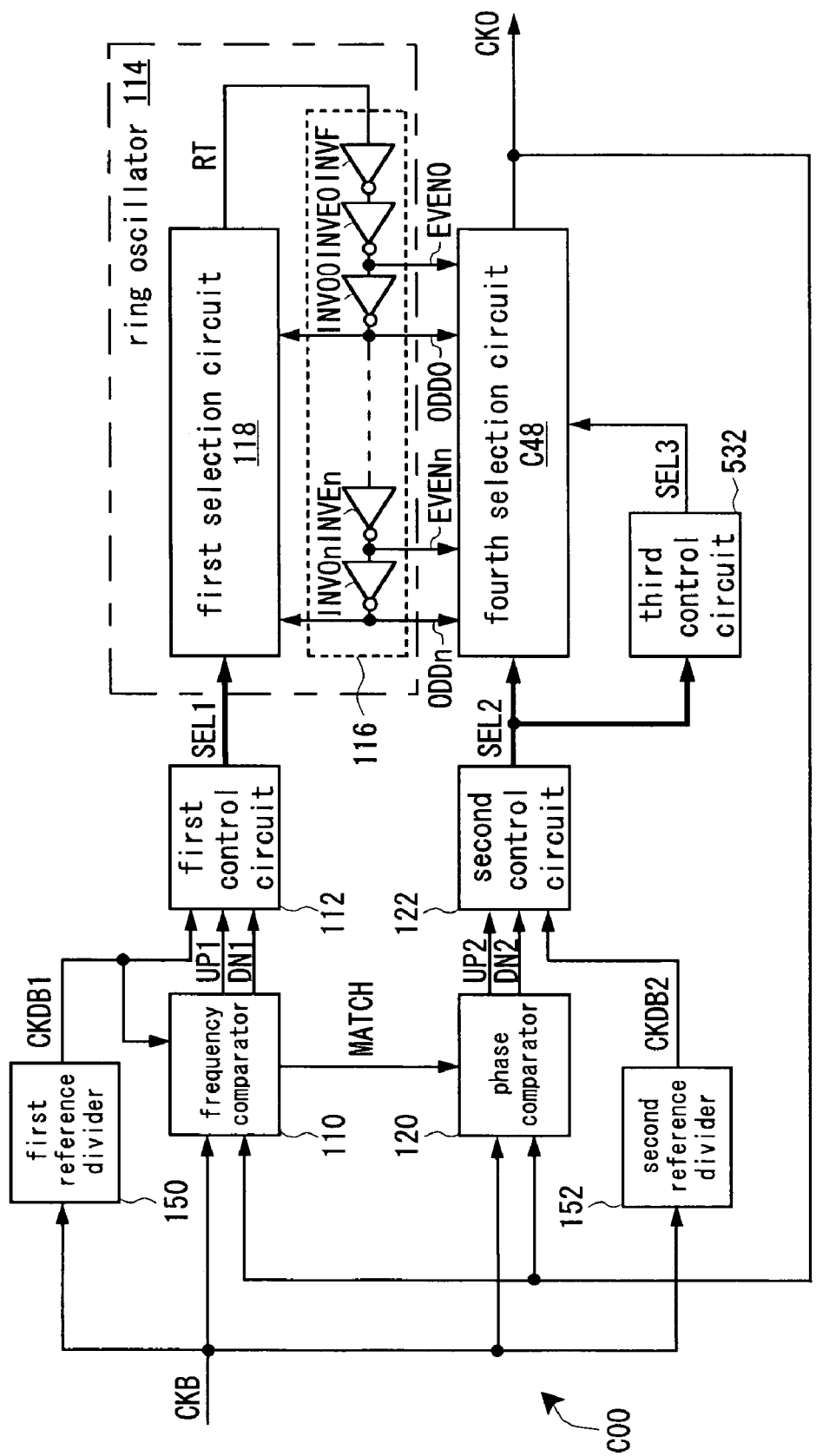
FIG. 22 is a block diagram showing a twelfth embodiment of the digital PLL circuit of the present invention.

FIG. 22 shows a twelfth embodiment of the digital PLL circuit of the present invention. The same reference numerals or symbols are used to designate the same elements as the elements described in the first and fifth embodiments, and detailed description thereof will be omitted.

A digital PLL circuit C00 is configured such that the third control circuit 532 of the fifth embodiment is added to the first embodiment, and it has a fourth selection circuit C48 in place of the second selection circuit 128 of the first embodiment. The other configuration is the same as that of the first embodiment. Note that in FIG. 22, inverters INVE (INVE0 to INVEn), INVO (INVO0 to INVOn) of a delay circuit 116 correspond to the buffers BUF (BUF0 to BUFn) of the first embodiment.

The fourth selection circuit C48 receives even output signals EVEN (EVEN0 to EVENn) outputted from the even-numbered inverters INVE and odd output signals ODD (ODD0 to ODDn). In a period during which a third selection signal SEL3 has a first logic level (for example, "logic 1"), the fourth selection circuit C48 selects one of the odd output signals ODD according to a second selection signal SEL2 to output it as an output clock CKO. In a period during which the third selection signal SEL3 has a second logic level (for example, "logic 0"), the fourth selection circuit C48 selects one of the even output signals EVEN according to the second selection signal SEL2 to output it as the output clock CKO. Consequently, a phase of the output clock CKO is inverted in synchronization with transition edges of the third selection signal SEL3.

In the twelfth embodiment, the phase of the output clock CKO is inverted when a counter value of a second up/down counter UDC2 (FIG. 4) in a second control circuit 122 changes from the maximum value to the minimum value, so that the phase of the output clock CKO can be delayed with respect to a phase corresponding to the maximum value of the counter value of the second up/down counter UDC2. Specifically, when the counter value of the second up/down counter UDC2 is changed from the maximum value to the minimum value by a counting operation, the fourth selection circuit C48 switches a signal to be selected, from the odd output signal ODDn to the even output signal EVEN0 (corresponding to falling edges of the third selection signal SEL3) or from the even output signal EVENn to the odd output signal ODD0 (corresponding to rising edges of the third selection signal SEL3).

Further, in the twelfth embodiment, the phase of the output clock CKO is inverted when the counter value of the second up/down counter UDC2 in the second control circuit 122 changes from the minimum value to the maximum value, so that the phase of the output clock CKO can be set ahead of a phase corresponding to the minimum value of the counter value of the second up/down counter UDC2. Specifically, when the counter value of the second up/down counterUDC2 is changed from the minimum value to the maximum value by the counting operation, the fourth selection circuit C48 switches a signal to be selected, from the odd output signal ODD0 to the even output signal EVENn (corresponding to the falling edges of the third selection signal SEL3) or from the even output signal EVEN0 to the odd output signal ODDn (corresponding to the rising edges of the third selection signal SEL3).

The twelfth embodiment described above can also provide the same effects as those of the first and fifth embodiments. In addition, the fourth selection circuit C48 is capable of outputting as the output clock CKO the even output signal EVEN outputted from the even-numbered inverter INVE. Consequently, it is possible to invert the phase of the output clock CKO with a simple circuitry compared with that of the fifth embodiment. As a result, a circuit scale can be reduced.

Incidentally, the foregoing tenth embodiment has described the example where the first transition detector A60 generates the first transition signal TR1. The present invention is not limited to such an embodiment. For example, when the first selection signal SEL1 is pulsed, the pulsed signal may be used in place of the first transition signal TR1.

The foregoing tenth embodiment has described the example where the second transition detector A62 generates the second transition signal TR2. The present invention is not limited to such an embodiment. For example, when the second selection signal SEL2 is pulsed, the pulsed signal may be used in place of the second transition signal TR2.

The foregoing embodiments have described the examples where the first control circuit is formed separately from the first selection circuit. The present invention is not limited to such embodiments. For example, the first control circuit may be formed in the first selection circuit.

The foregoing embodiments have described the examples where the second control circuit is formed separately from the second selection circuit. The present invention is not limited to such embodiments. For example, the second control circuit may be formed in the second selection circuit.

The invention is not limited to the above embodiments and various modifications may be made without departing from the spirit and scope of the invention. Any improvement may be made in part or all of the components.

What is claimed is:

1. A digital PLL circuit comprising:
   a frequency comparator that compares a frequency of a reference clock and a frequency of an output clock generated according to the reference clock, to output a frequency comparison signal indicating a result of the comparison;
   a frequency variable circuit comprising:
   a delay circuit having a plurality of inverting circuits connected in series; and
   a first selection circuit that adjusts the frequency of the output clock by selecting one of odd output signals outputted from odd-numbered inverting circuits out of said inverting circuits, according to the frequency comparison signal to supply a selected odd output signal to an input of said delay circuit as a feedback signal;
   a phase comparator comparing phases of the reference clock and the output clock to output a phase comparison signal indicating a result of the comparison;
   a second selection circuit adjusting the phase of the output clock by selecting one of the odd output signals according to the phase comparison signal to output a selected odd output signal as the output clock; and a first reference divider frequency-dividing the reference clock at a predetermined division ratio to output the divided reference clock as a first divided reference clock, wherein said frequency comparator comprises:

a first counter that counts the reference clock to output a counted value as a first counter value signal and that is reset in response to the first divided reference clock;

a second counter that counts the output clock to output a counted value as a second counter value signal and that is reset in response to the first divided reference clock; and a magnitude comparator that compares a first counter value indicated by the first counter value signal of said first counter and a second counter value indicated by the second counter value signal of said second counter to output a result of the comparison as the freguency comparison signal.

2. The digital PLL circuit according to claim 1, wherein:

said frequency comparator judges that the frequencies of the reference clock and the output clock match with each other to output a frequency match signal when a difference between the frequencies of the reference clock and the output clock falls within a predetermined range; and said phase comparator compares the phases of the reference clock and the output clock while the frequency match signal is being outputted.

3. The digital PLL circuit according to claim 1, wherein:

said magnitude comparator outputs a frequency match signal when the first and second counter values match with each other; and said phase comparator compares the phases of the reference clock and the output clock while the frequency match signal is being outputted.

4. The digital PLL circuit according to claim 1, wherein:

said magnitude comparator outputs a frequency match signal every time the first and second counter values match with each other; and said first reference divider is a variable divider that sequentially increases a cycle of the first divided reference clock in response to the frequency match signal.

5. The digital PLL circuit according to claim 1, further comprising a first control circuit outputting a first selection signal according to the frequency comparison signal, the first selection signal indicating an inverting circuit, out of said inverting circuits, outputting the odd output signal to be selected by said first selection circuit, wherein:

said first control circuit comprises a first up/down counter that either counts up or counts down according to the frequency comparison signal, in synchronization with the first divided reference clock to output a counted value as the first selection signal; and said first selection circuit receives the first selection signal as the frequency comparison signal.

6. The digital PLL circuit according to claim 5, wherein a counter value of said first up/down counter is set to a value indicating an inverting circuit on a subsequent stage side out of the odd-numbered inverting circuits before said frequency comparator starts comparing the frequencies of the reference clock and the output clock.

7. The digital PLL circuit according to claim 1, wherein:

said frequency comparator comprises a first adder that adds a predetermined value to the second counter value to output a result of the addition as an addition value signal; and said magnitude comparator receives the addition value signal as the second counter value signal.

8. The digital PLL circuit according to claim 7, further comprising:

a second reference divider frequency-dividing the reference clock at a predetermined division ratio to output the divided reference clock as a second divided reference clock; and a second control circuit outputting a second selection signal according to the phase comparison signal, the second selection signal indicating an inverting circuit, out of said inverting circuits, outputting the odd output signal to be selected by said second selection circuit, wherein:

said second selection circuit receives the second selection signal as the phase comparison signal;

said phase comparator comprises: a first divider frequency-dividing the reference clock at a predetermined division ratio to output the divided reference clock as a first divided clock; and a second divider frequency-dividing the output clock at a same division ratio as the division ratio of said first divider to output the divided output clock as a second divided clock;

said phase comparator compares phases of the first and second divided clocks to output a result of the comparison as the phase comparison signal;

said second control circuit comprises a down counter counting down according to the phase comparison signal in synchronization with the second divided reference clock to output a counted value as the second selection signal; and a counter value of said down counter is set to a value indicating an inverting circuit on a subsequent stage side out of the odd-numbered inverting circuits, before said phase comparator starts comparing the phases of the reference clock and the output clock.

9. The digital PLL circuit according to claim 1, wherein:

said frequency comparator comprises a first subtracter that subtracts a predetermined value from the first counter value to output a result of the subtraction as a subtraction value signal; and said magnitude comparator receives the subtraction value signal as the first counter value signal.

10. The digital PLL circuit according to claim 9, further comprising:

a second reference divider frequency-dividing the reference clock at a predetermined division ratio to output the divided reference clock as a second divided reference clock; and a second control circuit outputting a second selection signal according to the phase comparison signal, the second selection signal indicating an inverting circuit, out of said inverting circuits, outputting the odd output signal to be selected by said second selection circuit, wherein:

said second selection circuit receives the second selection signal as the phase comparison signal;

said phase comparator comprises: a first divider frequency-dividing the reference clock at a predetermined division ratio to output the divided reference clock as a first divided clock; and a second divider frequency-dividing the output clock at a same division ratio as the division ratio of said first divider to output the divided output clock as a second divided clock;

said phase comparator compares phases of the first and second divided clocks to output a result of the comparison as the phase comparison signal;

said second control circuit comprises a down counter counting down according to the phase comparison signal in synchronization with the second divided reference clock to output a counted value as the second selection signal; and a counter value of said down counter is set to a value indicating an inverting circuit on a subsequent stage side out of the odd-numbered inverting circuits, before said phase comparator starts comparing the phases of the reference clock and the output clock.

11. A digital PLL circuit comprising:

a frequency comparator that compares a frequency of a reference clock and a frequency of an output clock generated according to the reference clock, to output a frequency comparison signal indicating a result of the comparison;

a frequency variable circuit comprising:

a delay circuit having a plurality of inverting circuits connected in series; and a first selection circuit that adjusts the freguency of the output clock by selecting one of odd output signals outputted from odd-numbered inverting circuits out of said inverting circuits, according to the freguency comparison signal to supply a selected odd output signal to an input of said delay circuit as a feedback signal;

a phase comparator comparing phases of the reference clock and the output clock to output a phase comparison signal indicating a result of the comparison;

a second selection circuit adjusting the phase of the output clock by selecting one of the odd output signals according to the phase comparison signal to output a selected odd output signal as the output clock; and a first reference divider frequency-dividing the reference clock at a predetermined division ratio to output the divided reference clock as a first divided reference clock, wherein said frequency comparator comprises:

a first counter that counts the reference clock to output a counted value as a first counter value signal and that is reset in response to the first divided reference clock;

a second counter that counts the output clock to output a counted value as a second counter value signal and that is reset in response to the first divided reference clock; and a second subtracter that finds a difference between a first counter value indicated by the first counter value signal of said first counter and a second counter value indicated by the second counter value signal of said second counter to output a found value as the frequency comparison signal.

12. The digital PLL circuit according to claim 11, wherein:

said second subtracter outputs a frequency match signal when the first and second counter values match with each other; and said phase comparator compares the phases of the reference clock and the output clock while the frequency match signal is being outputted.

13. The digital PLL circuit according to claim 11, wherein:

said second subtracter outputs a frequency match signal every time the first and second counter values match with each other; and said first reference divider is a variable divider that sequentially increases a cycle of the first divided reference clock in response to the frequency match signal.

14. The digital PLL circuit according to claim 11, further comprising a first control circuit outputting a first selection signal that indicates an inverting circuit, out of said inverting circuits, outputting the odd output signal to be selected by said first selection circuit, according to the frequency comparison signal, wherein:

said first control circuit comprises: a second adder receiving the frequency comparison signal and the first selection signal, and adding a value indicated by the frequency comparison signal and a value indicated by the first selection signal to output a result of the addition as an updated value signal; and a storage circuit receiving the updated value signal in synchronization with the first divided reference clock to output a received value as the first selection signal; and said first selection circuit receives the first selection signal as the frequency comparison signal.

15. The digital PLL circuit according to claim 14, wherein said storage circuit is set to a value indicating an inverting circuit on a subsequent stage side out of the odd-numbered inverting circuits before said frequency comparator starts comparing the frequencies of the reference clock and the output clock.

16. The digital PLL circuit according to claim 11, wherein:

said frequency comparator comprises a first adder that adds a predetermined value to the second counter value to output a result of the addition as an addition value signal; and said second subtracter receives the addition value signal as the second counter value signal.

17. The digital PLL circuit according to claim 16, further comprising:

a second reference divider frequency-dividing the reference clock at a predetermined division ratio to output the divided reference clock as a second divided reference clock; and a second control circuit outputting a second selection signal according to the phase comparison signal, the second selection signal indicating an inverting circuit, out of said inverting circuits, outputting the odd output signal to be selected by said second selection circuit, wherein:

said second selection circuit receives the second selection signal as the phase comparison signal;

said phase comparator comprises: a first divider frequency-dividing the reference clock at a predetermined division ratio to output the divided reference clock as a first divided clock; and a second divider frequency-dividing the output clock at a same division ratio as the division ratio of said first divider to output the divided output clock as a second divided clock;

said phase comparator compares phases of the first and second divided clocks to output a result of the comparison as the phase comparison signal;

said second control circuit comprises a down counter counting down according to the phase comparison signal in synchronization with the second divided reference clock to output a counted value as the second selection signal; and a counter value of said down counter is set to a value indicating an inverting circuit on a subsequent stage side out of the odd-numbered inverting circuits, before said phase comparator starts comparing the phases of the reference clock and the output clock.

18. The digital PLL circuit according to claim 11, wherein:
said frequency comparator comprises a first subtracter that subtracts a predetermined value from the first counter value to output a result of the subtraction as a subtraction value signal; and
said second subtracter receives the subtraction value signal as the first counter value signal.

19. The digital PLL circuit according to claim 18, further comprising:
a second reference divider frequency-dividing the reference clock at a predetermined division ratio to output the divided reference clock as a second divided reference clock; and
a second control circuit outputting a second selection signal according to the phase comparison signal, the second selection signal indicating an inverting circuit, out of said inverting circuits, outputting the odd output signal to be selected by said second selection circuit, wherein:
said second selection circuit receives the second selection signal as the phase comparison signal;
said phase comparator comprises: a first divider frequency-dividing the reference clock at a predetermined division ratio to output the divided reference clock as a first divided clock; and a second divider frequency-dividing the output clock at a same division ratio as the division ratio of said first divider to output the divided output clock as a second divided clock;
said phase comparator compares phases of the first and second divided clocks to output a result of the comparison as the phase comparison signal;
said second control circuit comprises a down counter counting down according to the phase comparison signal in synchronization with the second divided reference clock to output a counted value as the second selection signal; and
a counter value of said down counter is set to a value indicating an inverting circuit on a subsequent stage side out of the odd-numbered inverting circuits, before said phase comparator starts comparing the phases of the reference clock and the output clock.

20. A digital PLL circuit comprising:
a frequency comparator that compares a frequency of a reference clock and a frequency of an output clock generated according to the reference clock, to output a frequency comparison signal indicating a result of the comparison;
a frequency variable circuit comprising:
a delay circuit having a plurality of inverting circuits connected in series; and
a first selection circuit that adjusts the frequency of the output clock by selecting one of odd output signals outputted from odd-numbered inverting circuits out of said inverting circuits, according to the frequency comparison signal to supply a selected odd output signal to an input of said delay circuit as a feedback signal;
a phase comparator comparing phases of the reference clock and the output clock to output a phase comparison signal indicating a result of the comparison; and
a second selection circuit adjusting the phase of the output clock by selecting one of the odd output signals according to the phase comparison signal to output a selected odd output signal as the output clock, wherein:
said phase comparator comprises: a first divider frequency-dividing the reference clock at a predetermined division ratio to output the divided reference clock as a first divided clock; and a second divider frequency-dividing the output clock at a same division ratio as the division ratio of said first divider to output the divided output clock as a second divided clock; and
said phase comparator compares phases of the first and second divided clocks to output a result of the comparison as the phase comparison signal.

21. The digital PLL circuit according to claim 20, further comprising:
a second reference divider frequency-dividing the reference clock at a predetermined division ratio to output the divided reference clock as a second divided reference clock; and
a second control circuit that outputs a second selection signal indicating an inverting circuit, out of said inverting circuits, outputting the odd output signal to be selected by said second selection circuit, according to the phase comparison signal, wherein:
said second control circuit comprises a second up/down counter that either counts up or counts down according to the phase comparison signal in synchronization with the second divided reference clock to output a counted value as the second selection signal; and
said second selection circuit receives the second selection signal as the phase comparison signal.

22. The digital PLL circuit according to claim 21, further comprising:
a third control circuit that outputs a third selection signal whose logic level is inverted when the counter value of said second up/down counter indicated by the second selection signal is changed from a maximum value to a minimum value and from the minimum value to the maximum value by a counting operation; and
a third selection circuit that alternately outputs an inverted output clock resulting from an inversion of the output clock and the output clock, in response to a transition edge of the third selection signal, wherein
said frequency comparator and said phase comparator receive the clock outputted from said third selection circuit as the output clock.

23. A digital PLL circuit comprising:
a frequency comparator that compares a frequency of a reference clock and a frequency of an output clock generated according to the reference clock, to output a frequency comparison signal indicating a result of the comparison:
a frequency variable circuit comprising:
a delay circuit having a plurality of inverting circuits connected in series; and
a first selection circuit that adjusts the frequency of the output clock by selecting one of odd output signals outputted from odd-numbered inverting circuits out of said inverting circuits, according to the frequency comparison signal to supply a selected odd output signal to an input of said delay circuit as a feedback signal;
a phase comparator comparing phases of the reference clock and the output clock to output a phase comparison signal indicating a result of the comparison;
a second selection circuit adjusting the phase of the output clock by selecting one of the odd output signals according to the phase comparison signal to output a selected odd output signal as the output clock;
a first control circuit that outputs a first selection signal of a plurality of bits indicating an inverting circuit, out of said inverting circuits, outputting the odd output signal to be selected by said first selection circuit, according to the frequency comparison signal;
a second control circuit that outputs a second selection signal of a plurality of bits indicating an inverting circuit, out of said inverting circuits, outputting the odd output signal to be selected by said second selection circuit, according to the phase comparison signal;

a first transition detector outputting a first transition signal during transition of the first selection signal;

a second transition detector outputting a second transition signal during transition of the second selection signal;

a first prohibition circuit disposed between an output of said first selection circuit and an input of said delay circuit to prohibit an output of said first selection circuit from propagating to said delay circuit while the first transition signal is being outputted; and a second prohibition circuit disposed between an output of said second selection circuit and inputs of said frequency comparator and said phase comparator to prohibit an output of said second selection circuit from propagating to said frequency comparator and said phase comparator while the second transition signal is being outputted, wherein:

said first selection circuit receives the first selection signal as the frequency comparison signal; and said second selection circuit receives the second selection signal as the phase comparison signal.

24. A digital PLL circuit comprising:

a frequency comparator that compares a frequency of a reference clock and a frequency of an output clock generated according to the reference clock, to output a frequency comparison signal indicating a result of the comparison;

a frequency variable circuit comprising:

a delay circuit having a plurality of inverting circuits connected in series; and a first selection circuit that adjusts the frequency of the output clock by selecting one of odd output signals outputted from odd-numbered inverting circuits out of said inverting circuits, according to the frequency comparison signal to supply a selected odd output signal to an input of said delay circuit as a feedback signal;

a phase comparator comparing phases of the reference clock and the output clock to output a phase comparison signal indicating a result of the comparison;

a second selection circuit adjusting the phase of the output clock by selecting one of the odd output signals according to the phase comparison signal to output a selected odd output signal as the output clock;

a third reference divider frequency-dividing the reference clock at a predetermined division ratio to output the divided reference clock as a third divided reference clock; and a first output divider frequency-dividing the output clock outputted from said second selection circuit at a predetermined division ratio to output the divided output clock as a first divided output clock, wherein said frequency comparator and said phase comparator receive the third divided reference clock as the reference clock and receive the first divided output clock as the output clock.

25. The digital PLL circuit according to claim 24, further comprising:

a second output divider frequency-dividing the output clock outputted from said second selection circuit at a predetermined division ratio to output the divided output clock as a second divided output clock; and a third output divider frequency-dividing the second divided output clock at a predetermined division ratio to output the divided second divided output clock as the output clock, wherein said first output divider receives the second divided output clock as the output clock.

26. A digital PLL circuit comprising:

a frequency comparator comparing a frequency of a reference clock and a frequency of an output clock generated according to the reference clock, to output a frequency comparison signal indicating a result of the comparison;

a frequency variable circuit comprising:

a delay circuit having a plurality of inverting circuits connected in series; and a first selection circuit that adjusts the frequency of the output clock by selecting one of odd output signals outputted from odd-numbered inverting circuits out of said inverting circuits, according to the frequency comparison signal to supply the selected odd output signal to an input of said delay circuit as a feedback signal;

a phase comparator comparing phases of the reference clock and the output clock to output a phase comparison signal indicating a result of the comparison;

a second up/down counter that either counts up or counts down according to the phase comparison signal in synchronization with the reference clock to output a counted value as a second selection signal;

a third control circuit that outputs a third selection signal whose logic level is inverted when the counter value of said second up/down counter indicated by the second selection signal is changed from a maximum value to a minimum value and from the minimum value to the maximum value by a counting operation;

a fourth selection circuit that receives even output signals outputted from even-numbered inverting circuits out of said inverting circuits and the odd output signals, and that adjusts the phase of the output clock by selecting one of the odd output signals according to the second selection signal to output the selected odd output signal as the output clock in a period during which the third selection signal has a first logic level, while selecting one of the even output signals according to the second selection signal to output the selected even output signal as the output clock in a period during which the third selection signal has a second logic level; and a first reference divider frequency-dividing the reference clock at a predetermined division ratio to output the divided reference clock as a first divided reference clock, wherein said frequency comparator comprises:

a first counter that counts the reference clock to output a counted value as a first counter value signal and that is reset in response to the first divided reference clock;

a second counter that counts the output clock to output a counted value as a second counter value signal and that is reset in response to the first divided reference clock; and a magnitude comparator that compares a first counter value indicated by the first counter value signal of said first counter and a second counter value indicated by the second counter value signal of said second counter to output a result of the comparison as the frequency comparison signal.

* * * * *